United States Patent
Hyde et al.

(10) Patent No.: US 10,423,884 B2
(45) Date of Patent: Sep. 24, 2019

(54) EXTENSION OF MODEL-BASED DESIGN TO IDENTIFY AND ANALYZE IMPACT OF RELIABILITY INFORMATION ON SYSTEMS AND COMPONENTS

(71) Applicant: The MathWorks, Inc., Natick, MA (US)

(72) Inventors: Richard Hyde, Bristol (GB); Ebrahim M. Mestchian, Newton, MA (US)

(73) Assignee: The MathWorks, Inc., natick, MA (US)

( * ) Notice: Subject to any disclaimer, the term of this patent is extended or adjusted under 35 U.S.C. 154(b) by 137 days.

(21) Appl. No.: 15/171,613

(22) Filed: Jun. 2, 2016

(65) Prior Publication Data

US 2016/0357895 A1  Dec. 8, 2016

Related U.S. Application Data

(60) Provisional application No. 62/171,082, filed on Jun. 4, 2015, provisional application No. 62/262,179, filed on Dec. 2, 2015.

(51) Int. Cl.
  *G06F 17/50* (2006.01)
  *G06N 7/00* (2006.01)
(52) U.S. Cl.
  CPC ......... *G06N 7/005* (2013.01); *G06F 17/5009* (2013.01)
(58) Field of Classification Search
  None
  See application file for complete search history.

(56) References Cited

U.S. PATENT DOCUMENTS

| | | | |
|---|---|---|---|
| 5,278,769 A | 1/1994 | Bair et al. | |
| 5,887,154 A | 3/1999 | Iwasa et al. | |
| 8,935,133 B1 | 1/2015 | Berg et al. | |
| 2003/0004678 A1 | 1/2003 | Zhang et al. | |
| 2003/0093255 A1* | 5/2003 | Freyensee | G06F 17/5009 703/13 |
| 2006/0064669 A1 | 3/2006 | Ogilvie et al. | |

(Continued)

FOREIGN PATENT DOCUMENTS

| | | |
|---|---|---|
| JP | H08190587 A | 7/1996 |
| JP | H0991336 A | 4/1997 |

(Continued)

OTHER PUBLICATIONS

Fitzpatrick, "Monte Carlo Analysis," In: "Analog Design and Simulation using OrCAD Capture and PSpice," Oct. 7, 2011, Elsevier, XP055298200, ISBN: 978-0-08-097095-0, pp. 135-147.

(Continued)

*Primary Examiner* — Craig C Dorais
(74) *Attorney, Agent, or Firm* — Young Basile Hanlon & MacFarlan, P.C.

(57) ABSTRACT

Methods and devices for providing and using a technical computing environment (TCE) for receiving a TCE model that, when executed, simulates behavior of a dynamic physical system, and that represents one or more physical components and their respective reliability information in a block diagram model. Applications of the model include automated system-level datasheet and bill of materials generation, component reliability information discovery, fault and stress assertions, and identification of emergent faults.

24 Claims, 24 Drawing Sheets

(56) References Cited

U.S. PATENT DOCUMENTS

| | | |
|---|---|---|
| 2013/0238292 A1 | 9/2013 | Kirsanov |
| 2013/0304439 A1* | 11/2013 | Van der Velden ............................ G06F 17/5009 703/6 |
| 2014/0245250 A1* | 8/2014 | Hibbeler ............. G06F 17/5045 716/133 |
| 2015/0142402 A1* | 5/2015 | Ramesh .............. G06F 17/5009 703/7 |

FOREIGN PATENT DOCUMENTS

| | | |
|---|---|---|
| JP | 2009265779 A | 11/2009 |
| JP | 2009-295007 A | 12/2009 |
| JP | 2014241065 A | 12/2014 |
| WO | 2006123040 A2 | 11/2006 |
| WO | 2007049013 A1 | 5/2007 |

OTHER PUBLICATIONS

Altera Corporation, "White Paper WP-01208-1.0: Hardware in the Loop from the MATLAB/Simulink Environment," Sep. 1, 2013, XP055298345, retrieved from the internet: URL:https://www.altera.com/literature/wp/wp-01208-hardware-in-the-loop.pdf (retrieved on Aug. 29, 2016).
Communication from the EPO including European Search Report from related European Application No. EP16173028 dated Sep. 19, 2016.

* cited by examiner

Resistor parameterization

FIG. 7B

| Main | Operating Limits | Faults | Noise |

745

Enable operating limits: [Yes]

Reporting if operating limits exceeded: [Warn]

Maximum working voltage: [100] [V]

Power rating: [1] [W]

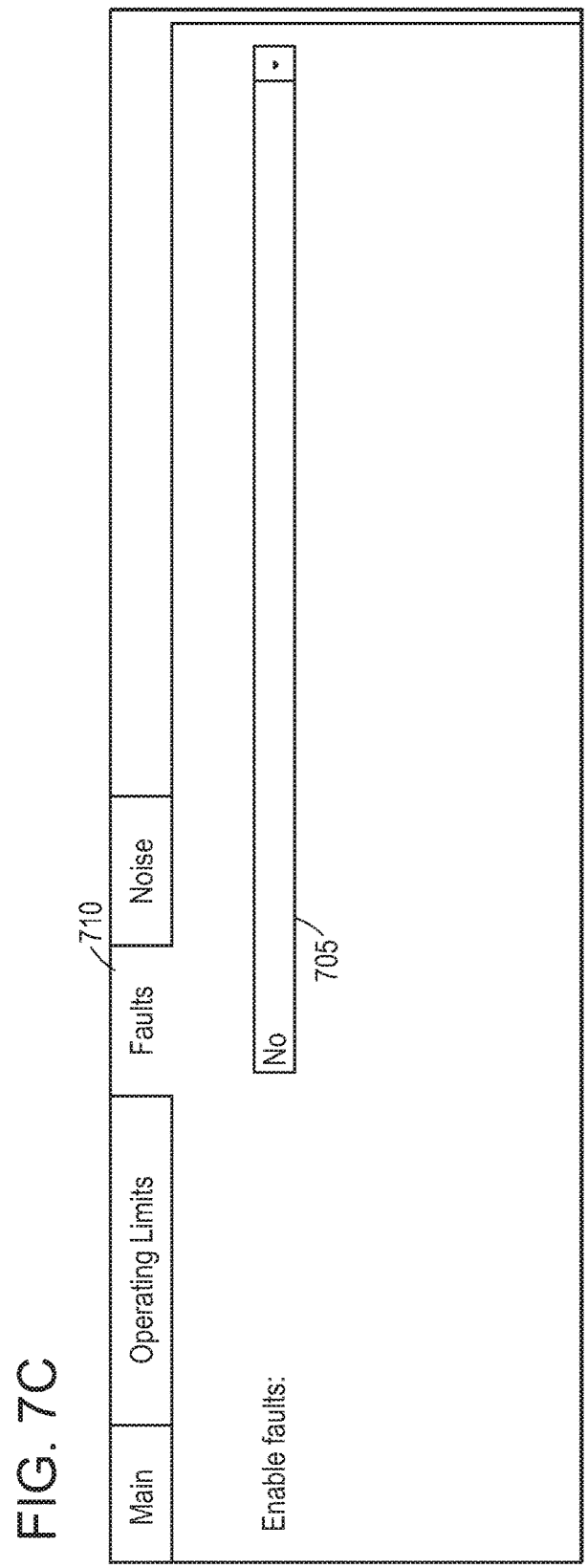

Resistor

This block models as a resistor with optional tolerance, operational limits, fault and thermal noise modelling. To model temperature effects, select the thermal variant of this block by right-clicking on the block and selecting Simscape block choices and Show thermal port.

Source code

Settings /745

| Main | Operating Limits | Faults | Noise | Temperature Dependance | Thermal Port /711 |

| Enable opertating limits: | Yes | ▸ |
| Reporting if operating limits exceeded: | Warn | ▸ |
| Power rating: | 1 | W ▸ |
| Maximum working voltage: | 100 | V ▸ |
| Temperature below which full power rating is available: | 70 | C ▸ |
| Temperature above which power rating is reduced to zero: | 155 | C ▸ |
| Operating temperature range [Tmin Tmax]: | [-50 150] | C ▸ |

[ OK ] [ Cancel ] [ Help ] [ Apply ]

FIG. 7D

| Main | Operating Limits | Faults |
|---|---|---|
| Enable operating limits: | | Yes |
| Reporting if operating limits exceeded: | | Warn |
| Working voltage range: | | [-0.1 50] V |
| Power rating: | | 10 W |

| Main | Operating Limits | Faults |
|---|---|---|
| Enable faults: | | No |

Inductor

This block models an inductor with optional tolerance, operational limits, and fault modeling.

Source code

Settings

| Main | Operating Limits | Faults |

Inductance: 0.5e-3   H

Tolerance (%): 20

Tolerance application: Random tolerance

Tolerance distribution: Uniform

Series resistance: 0.02   Ohm

Parallel conductance: 0   1/Ohm

Initial inductor current: 0   A

[OK] [Cancel] [Help] [Apply]

Inductor parameterization

FIG. 9A

| Main | Operating Limits | Faults | |
|---|---|---|---|
| Enable operating limits: | Yes | | |
| Reporting if operating limits exceeded: | Warn | | |
| Saturation current: | 10 | A | |
| Power rating: | 20 | W | |

FIG. 9B

| Main | Operating Limits | Faults — 905 | |
|---|---|---|---|
| Enable faults: | Yes | | |
| Reporting when a fault occurs: | Warn | | |
| Location of fault node (% of total turns from - terminal): | 25 | | |
| Faulted coupling factor: | 0.9 | | |
| Short-circuit turns: | To negative terminal | | |
| Open-circuit at fualt node: | No | | |
| Ground fault: | No | | |
| Fault transition time constant: | 1e-4 | s | |
| Enable temporal fault trigger: | No | | |
| Enable behavioral fault trigger: | Yes | | |
| Maximum permissable voltage: | 40 | V | |
| Number of events to fail when exceeding voltage: | 5 | | |
| Maximum permissible current: | 10 | A | |
| Time to fail when exceeding current: | 1e-5 | s | |

FIG. 9C

| Capacitor Style | Relative Failure Mode Probability | | | |
|---|---|---|---|---|
| | Open | Short | Vault Change | Electrolyte Leakage |
| Mica/Glass | 13 | 72 | 15 | |
| Paper | 37 | 63 | | |
| Plastic | 42 | 40 | 18 | |
| Ceramic | 22 | 49 | 29 | |
| Tantalum, Chip | 32 | 57 | 11 | |
| Tantalum, Electrolytic | 17 | 69 | 14 | |
| Aluminum, Electrolytic | 35 | 53 | 2 | 10 |
| Variable Piston | 10 | 30 | 60 | |

FIG. 11

EXTENSION OF MODEL-BASED DESIGN TO IDENTIFY AND ANALYZE IMPACT OF RELIABILITY INFORMATION ON SYSTEMS AND COMPONENTS

CROSS-REFERENCE TO RELATED APPLICATIONS

This application claims the benefit of priority to U.S. Provisional Application No. 62/171,082, filed Jun. 4, 2015, and 62/262,179, filed Dec. 2, 2015, the contents of each of which are incorporated herein by reference.

BRIEF DESCRIPTION OF THE FIGURES

The accompanying drawings, which are incorporated in and constitute a part of this specification, illustrate one or more implementations and, together with the description, explain these implementations. The features of the implementations will be apparent from the following drawings, wherein like reference numbers generally indicate identical, functionally similar, and/or structurally similar elements. In the drawings:

FIGS. 7A-7D are screenshots of exemplary TCE dialog boxes for reviewing and/or editing reliability parameters for a modeled resistor;

FIGS. 8A-8C are screenshots of exemplary TCE dialog boxes for reviewing and/or editing reliability parameters for a modeled capacitor;

FIGS. 9A-9C are screenshots of exemplary TCE dialog boxes for reviewing and/or editing reliability parameters for a modeled inductor;

FIG. 11 is a U.S. Navy capacitor failure mode distributions reference table;

DETAILED DESCRIPTION

The following detailed description of example implementations refers to the accompanying drawings noted above.

I. OVERVIEW

Conventional system design typically relies significantly on a designer's experience, and often new designs are an evolution of a previous one, in order to manage risk. Such conventional approaches depend on the designer's time-consuming considerations of all possible physical component fault cases, and the correct identification of causal relationships between one component fault and impact on the probability of failure on another component. System performance is checked by a combination of simulation models and model validation against prototypes. The focus for simulation is usually normal operating conditions, plus readily identifiable extreme cases (e.g., of temperature) and failure cases (e.g. of a specific component in the system). It is often assumed that failure states are binary (available or failed), whereas in reality components may start to fail over time, which may cause the behavior of the physical component to change over time. These changes in behavior may contribute to, or may invoke, failures in other components of the physical system (due to being off a design point) before the other components catastrophically fail themselves. Also, a system itself may no longer behave desirably due to undesired behaviors of one or more of its components, even though none of the components has catastrophically failed. Several examples of undesired or degraded performance triggering other components failures include, system instability or limit cycles because the failing component is altering the frequency characteristics of a feedback loop, perhaps due to component aging; excess heat generation which causes adjacent components to exceed their valid operational range; and increased power consumption resulting in supply over-load.

Figure 1:
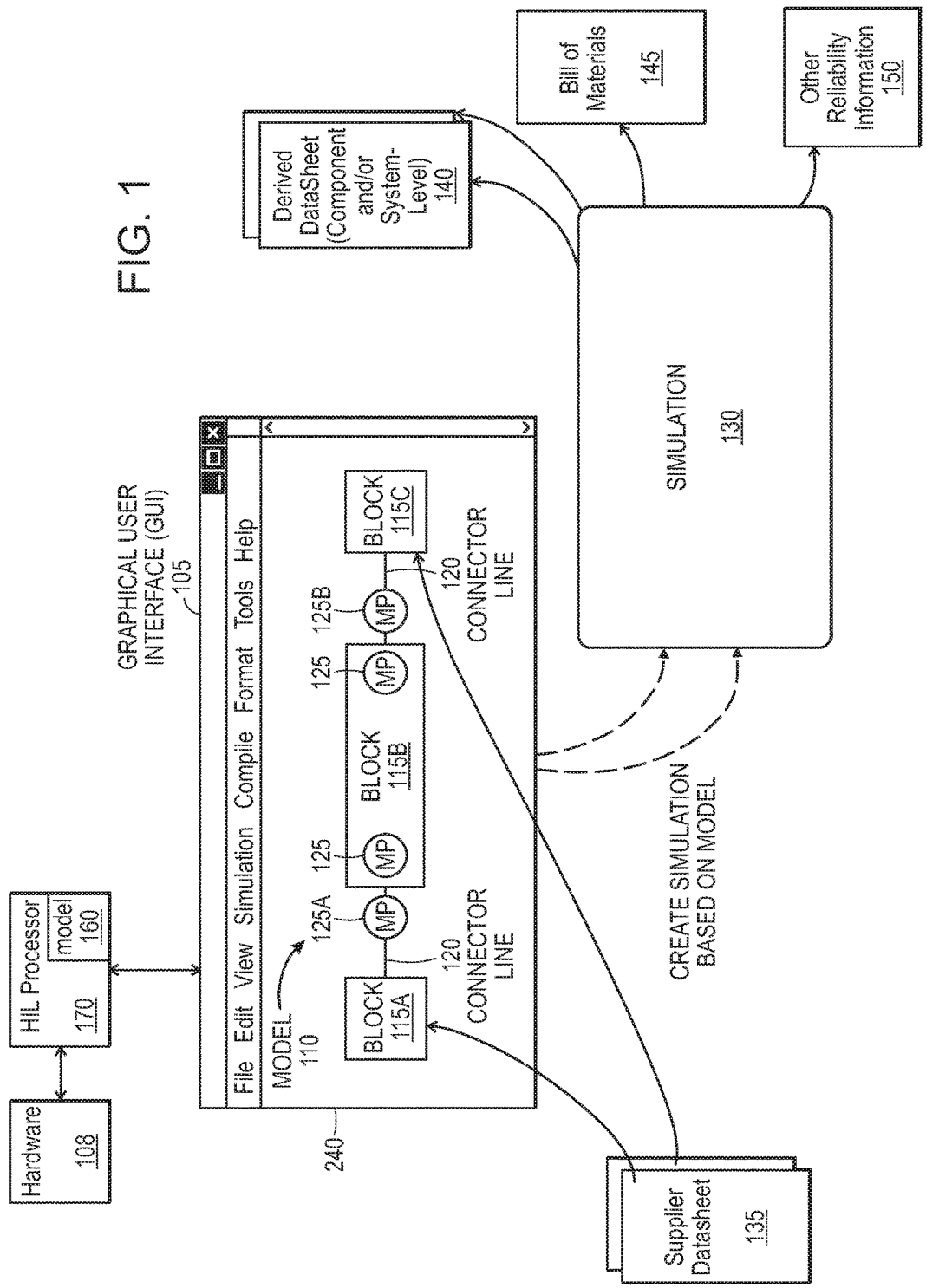
FIG. 1 is a diagram of an overview of an example implementation described herein.

The methods and systems described herein relate to reliability engineering (e.g., designing systems or components to perform one or more functions under stated conditions for a specified period of time), and to validating and verifying design and operation of physical systems through the use of computer implemented models. The methods and systems also may facilitate correct identification of causal relationships between one component fault and impact on the probability of failure on one or more other components, and/or on the system as a whole. FIG. 1 is a diagram of an example overview of an implementation described herein. As depicted, the overview may include a graphical user interface (GUI) 105, a model 110, blocks 115A-1115C, connector lines 120, measurement points (MPs) 125, and a simulation 130. GUI 105 may be provided to permit a user to interact with a technical computing environment (TCE) 240 to create model 110. Model 110 may provide a visual and/or functional representation of a dynamic physical system, a device, a process, an operation, a feature, or a mechanism corresponding to a discipline or a domain (e.g., mathematics, science, engineering, medicine, economics, business, etc.). For instance, model 110 may correspond to an electrical circuit, a hydraulic system, an internal combustion engine, etc. As such, model 110 may include model components 115A-115C, such as blocks, that are interconnected by the connector lines 120. Those skilled in the art will recognize that the term "blocks" does not refer exclusively to model elements that include blocks but may also include other modeling elements, such as labels, lines, and annotations, etc., that aid in readability and modularity of block diagrams.

Model components 115A-115C may each perform a function depending on the nature of the physical component (e.g., hardware device, a system, a subsystem, etc.) being modeled and the system model as a whole. Connector lines 120 may represent signal values or physical constraints in the case of physical connections. A device may execute the model 110 in a simulation 130 of the physical system in one or many simulation loops, for example, varying certain values associated with operational parameters of the model components. The model 110 may include reliability information for the model components 115A-115C and/or for the entire system (or a subsystem thereof) During a simulation 130, testing, measuring or otherwise evaluating the performance of the model components, subsystem or system, or signals at any point in the model may be performed, for example at measurement points 125. Measurement points 125 may enable measurements to be taken with respect to a function, a process, an operation, a behavior, or another type of characteristic (e.g., an operational characteristic) corresponding to a given model component 115B or a group of components 115A-115C. Where component 115B corresponds to an electrical circuit component, measurement points 125 may enable a user to take a measurement corresponding to an electrical current, an electrical potential, an electrical resistance, an electrical continuity, a component integrity, or another type of characteristic corresponding to component 115B. In some implementations, such measurements may be performed within simulation 130.

In some implementations, simulation 130 may be created directly within GUI 105 used to create model 110, while in other implementations, model 110 may also, or alternatively, be used to create an executable data structure that may be used to generate simulation 130. The data structure may also, or alternatively, be provided to another device (e.g., analog hardware, digital hardware, etc.) to enable the other computing device to create the simulation. In some implementations, simulation 130 may include, for example, a GUI generated by a user device (e.g., a desktop computer). In other implementations, simulation 130 may also include one or more devices (e.g., a motor, an electronic circuit board, and electronic probes or other measuring devices) connected to, and capable of communicating with, the user device providing the GUI.

As will be described in greater detail below, in some implementations reliability information for certain model components 115A-115C may be extracted from manufacturer datasheets 135 for the one or more physical components being modeled. Additionally or alternatively, simulation 130 may automatically generate from the model one or more component or system-level datasheet 140, bill of materials 145, or other system or component reliability information 150 (e.g., fault trees, performance ratings, tolerances, predicted failures, cascading component failures, emergent properties of the system, etc.).

A model 110 may include definitions of normal and faulted behavior of model components. The component fault conditions may have associated failure probability distributions for specific model components 115, and of possible combinations of model component failures that might lead to a total system failure. Reliability models, generally, may be expressed using fault trees and conditional/Bayesian probability analysis. One common application for reliability models is computer implemented systems design, whereby a physical system is to be constructed from a number of virtual model components in a desired topology in order to perform one or more required functions with a quantified reliability level, e.g., a set of reliability information with defined and/or undefined values for each definable reliability information data element, parameter, etc. (examples of which are discussed further below), for a model component, groups of model components, applications and/or system models. Modeled components may represent physical parts across multiple domains, such as electrical (e.g., circuits, power electronics, etc.), optical, hydraulic (e.g., pumps, etc.), electromechanical (e.g., pumps), biomechanical, and algorithmic/computer-controlled parts. A design task is to find a solution that minimizes cost whilst delivering the required functions, possibly to a quantified reliability level.

The method and device implementations of this disclosure permit system design engineering that accounts for more realistic reliability characteristics, e.g., where failure modes are not limited to catastrophic failure, and instead includes undesired behaviors such as degraded component performance, and where model components may be assigned (or have automatically determined) tolerances, operating limits and behaviorally-triggered faults.

II. EXAMPLE COMPUTING ENVIRONMENT

Figure 2:
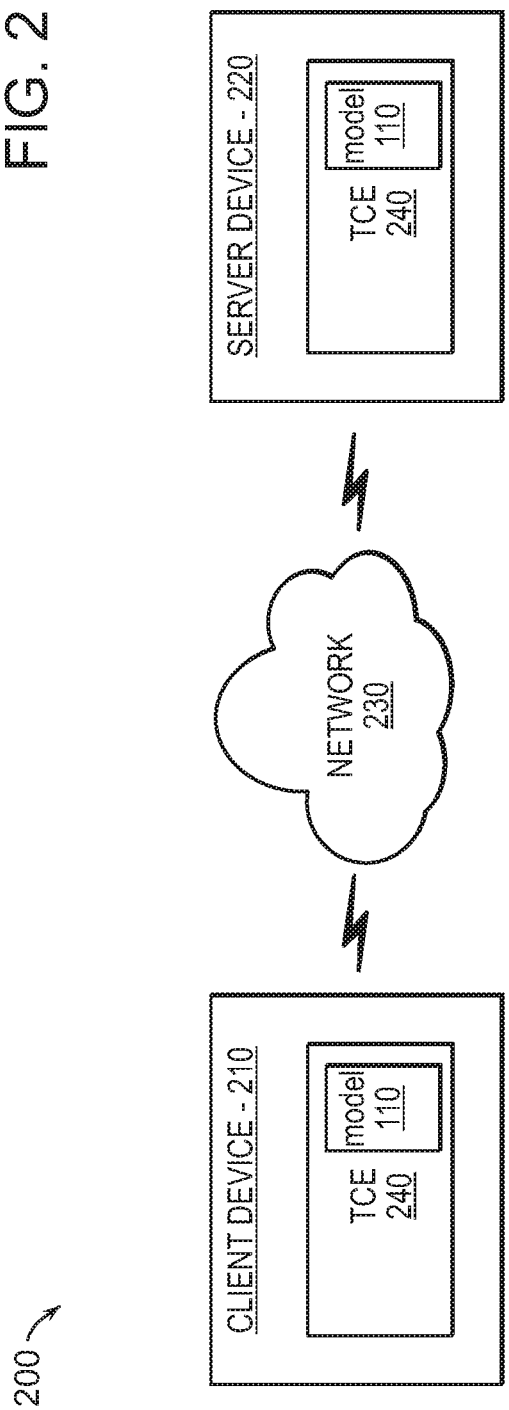
FIG. 2 is a diagram of an example environment in which systems and/or methods described herein may be implemented.

The methods and systems described herein relate to both bottom-up (model component level) and top-down (system level) approaches to using model-based design to support the design process. FIG. 2 is a diagram of an example environment 200 in which a dynamic physical system may be modeled by TCE 240, and the dynamic system model 110 may be executed to simulate the physical system in order to generate a result. The TCE 240 may provide a graphical programming or modeling environment (e.g., a block diagram environment) that generates the dynamic system model 110 including multiple model components having modifiable assigned data (e.g., reliability attributes.) As illustrated, environment 200 may include a client device 210 interconnected with a server device 220 via a network 230. Components of environment 200 may interconnect via wired and/or wireless connections. A single client device 210, server device 220, and network 230 have been illustrated in FIG. 2 for simplicity. In practice, environment 200 may include more client devices 210, server devices 220, and/or networks 230. In one example implementation, client device 210 and server device 220 may be provided in a single device or may be provided in separate devices.

Although FIG. 2 shows example components of environment 200, in other implementations, environment 200 may include fewer components, different components, differently arranged components, and/or additional components than those depicted in FIG. 2. Alternatively, or additionally, one or more components of environment 200 may perform one or more other tasks described as being performed by one or more other components of environment 200.

Client device 210 may include one or more devices that are capable of communicating with server device 220 via network 230. For example, client device 210 may include a laptop computer, a personal computer, a tablet computer, a desktop computer, a workstation computer, a smart phone, a personal digital assistant (PDA), and/or other computation and communication devices.

Server device 220 may include one or more server devices, or other types of computation and communication devices, that gather, process, and/or provide information in a manner described herein. Server device 220 may include a device that is capable of communicating with client device 210 (e.g., via network 230). In one example, server device 220 may include one or more laptop computers, personal computers, workstation computers, servers, central processing units (CPUs), graphical processing units (GPUs), application-specific integrated circuits (ASICs), field-programmable gate arrays (FPGAs), etc. and/or software (e.g., a simulator) executing on the aforementioned devices. In one example, server device 220 may include TCE 240 and may perform some or all of the functionality described herein for client device 210. Alternatively, server device 220 may be omitted and client device 210 may perform all of the functionality described herein for client device 210.

Network 230 may include a network, such as a local area network (LAN), a wide area network (WAN), a metropolitan area network (MAN), a telephone network, such as the Public Switched Telephone Network (PSTN), an intranet, the Internet, or a combination of networks. Network 230 may be a communication network that includes digital and/or analog aspects. Information exchanged in network 230 may include machine-readable information having a format that may be used, for example, in network 230, with one or more components in network 230 (e.g., switches, routers, gateways, etc.) and/or with devices coupled to network 230, such as client device 210 and server device 220. For example, network information may be encapsulated in one or more packets that may be used to transfer the information through the network 230. Information may be exchanged between components in network 230 using various communication protocols, such as, but not limited to, the Internet Protocol (IP), Asynchronous Transfer Mode (ATM), Synchronous Optical Network (SONET), the User Datagram Protocol (UDP), Transmission Control Protocol (TCP), Institute of Electrical and Electronics Engineers (IEEE) 802.11, or other communication protocol.

Portions of network 230 may be wired (e.g., using wired conductors, optical fibers, wave guides, etc.) and/or wireless (e.g., using free-space optical (FSO), radio frequency (RF), acoustic transmission paths, etc.). Portions of network 230 may include a substantially open public network, such as the Internet. Portions of network 230 may include a more restricted network, such as a private corporate network or virtual private network (VPN). It should be noted that implementations of communication networks and/or devices operating on communication networks described herein are not limited with regards to, for example, information carried by the communication networks, protocols used in the communication networks, and/or the architecture/configuration of the communication networks.

TCE 240 may be provided within a computer-readable medium of client device 210. Alternatively, or additionally, TCE 240 may be provided in another device (e.g., server device 220) that is accessible by client device 210. TCE 240 may include hardware or a combination of hardware and software that provides a computing environment that allows users to perform tasks related to disciplines, such as, but not limited to, mathematics, science, engineering, medicine, business, etc., more efficiently than if the tasks were performed in another type of computing environment, such as an environment that required the user to develop code in a conventional programming language, such as C++, C, Fortran, Pascal, etc. In one implementation, TCE 240 may include a dynamically-typed and/or array-based programming language (e.g., the M language, a MATLAB® language, a MATLAB-compatible language, a MATLAB-like language, etc.) that can be used to express problems and/or solutions in mathematical notations.

For example, TCE 240 may use an array as a basic element, where the array may not require dimensioning. These arrays may be used to support array-based programming where an operation may apply to an entire set of values included in the arrays. Array-based programming may allow array-based operations to be treated as high-level programming that may allow, for example, operations to be performed on entire aggregations of data without having to resort to explicit loops of individual non-array operations. In addition, TCE 240 may be adapted to perform matrix and/or vector formulations that can be used for data analysis, data visualization, application development, simulation, modeling, algorithm development, etc. These matrix and/or vector formulations may be used in many areas, such as statistics, image processing, signal processing, control design, life sciences modeling, discrete event analysis and/or design, state based analysis and/or design, etc.

TCE 240 may further provide mathematical functions and/or graphical tools (e.g., for creating plots, surfaces, images, volumetric representations, or other representations, etc.). In one implementation, TCE 240 may provide these functions and/or tools using toolboxes (e.g., toolboxes for signal processing, image processing, data plotting, parallel processing, etc.) suitable for use by non-professional programmers. Alternatively, or additionally, TCE 240 may provide these functions as block sets or in another way, such as via a library, etc. example, via a library, local or remote database (e.g., a database operating in a computing cloud), remote procedure calls (RPCs), and/or an application programming interface (API). Examples of graphically-based modeling environments that may be suitable for use in the methods and systems described herein include: Simulink® software, Stateflow® software, SimEvents® software, Simscape™ software, etc., by The MathWorks, Inc.; VisSim by Visual Solutions; LabView® by National Instruments; Dymola by Dynasim; SoftWIRE by Measurement Computing; WiT by DALSA Coreco; VEE Pro or SystemVue by Agilent; Vision Program Manager from PPT Vision; Khoros from Khoral Research; Gedae by Gedae, Inc.; Scicos from (INRIA); Virtuoso from Cadence; Rational Rose from IBM; Rhopsody or Tau from Telelogic; SystemModeler from Wolfram; and Ptolemy from the University of California at Berkeley; Such systems may employ physical network approaches and may include sets of block libraries and special simulation features for modeling physical components interconnected in to one or more systems.

A physical network approach is particularly suited for simulating systems that comprise dynamic physical components. A dynamic system (either natural or man-made) is a system whose response at any given time is a function of its input stimuli, its current state, and the current time. Physical dynamic systems include, for example, a falling body, the rotation of the earth, bio-mechanical systems (muscles, joints, etc.), bio-chemical systems (gene expression, protein pathways), weather and climate pattern systems, a bouncing ball, a spring with a mass tied on an end, electrical or fluidic or optical systems, automobiles, airplanes, control systems in major appliances, communication networks, audio signal processing, nuclear reactors, a stock market, etc.

Figure 5:
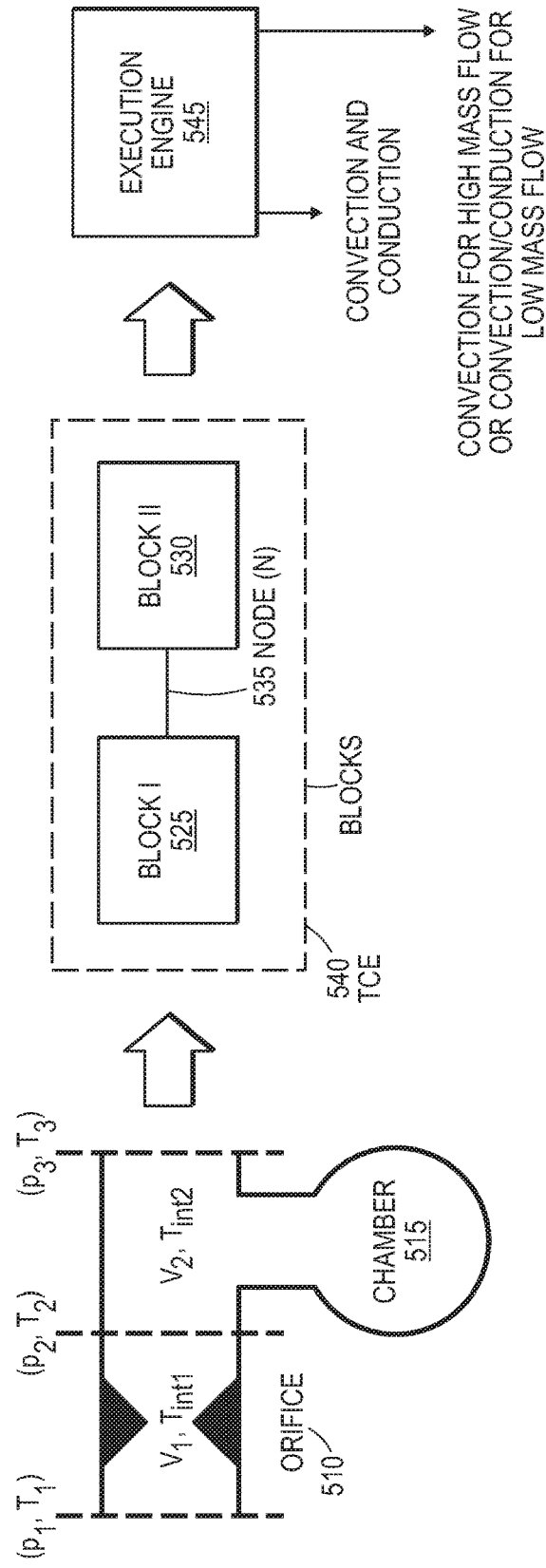
FIG. 5 is workflow diagram for representing and modeling a physical network in a simulation model.

Physical network modeling environments permit creation of network representations of systems under design. An executable block diagram model of a physical system may be represented schematically as a collection of blocks interconnected by lines that represent constraints on physical values such as voltages or pressures. FIG. 5 is a diagram illustrating an overview 500 of a physical network approach to modeling a simplified example thermal fluid physical system 505 comprised of an orifice 510 and chamber 515. As shown, a TCE 540 is used to generate a thermal fluid model 520 comprised of model components (e.g., functional blocks 525, 530) representing the physical components 510, 515 that interact with each other via their connection node 535 which defines relationships between variables (e.g., pressures and mass flows, etc.) used in blocks 525 and 530. Each block itself may represent a dynamic system. The node 535, in this example, is bidirectional and mimics physical connections between the modeled physical components 510, 515 of physical system 505.

Each of the functional blocks 525, 530 and the thermal fluid model 520 may have associated therewith reliability information that may include failure mode dynamics that may be probabilistic (e.g., based on component age, extreme environmental conditions, etc.) and/or stochastic (e.g., mean time before failure based on random probability distributions that may be analyzed statistically but not precisely predicted, etc.), performance characteristics, operating limits, tolerances, and dependencies of said nominal operational values/tolerances on aging and/or adjacent components and/or fault conditions. The values and/or ranges for some of the reliability information may be known (e.g., extracted from manufacturers' datasheets, loaded from libraries, etc.) or, as will be described in the context of some implementations, may initially be unknown but determined through simulation by execution of the thermal fluid model 520 by an execution engine 545 (of the TCE 540.) These values and/or ranges may be determined as requirements for an, as-yet, unselected component.

In one example implementation, the TCE 540 may also receive information associated with the physical system 505, such as external operating conditions, and may create the model based on the reliability information associated with the physical system 505, the model components, and the external operating conditions to simulate operation of the physical system 505.

The physical network approach may compute physical operating values resulting from physical equations that are well-known or developed by users. Information may be propagated and stored in the model using "across" (or equivalently "potential" variables) and "through" (or equivalently "flow") variables. Nodes, such as node 535, may store the "across" variables common to connected blocks 525, 530, and the blocks 525, 530 store the "through" variables. In other words, the blocks may interact with the rest of the model through these two types of variables. To ensure conservation of physical values, a model solver may require an algebraic sum of "through" variables, such as mass (e.g., fluid) flow, electrical current, heat flow, mechanical torque or power flux, to be zero at connecting nodes.

The physical network may comprise any component, structure, mechanism, or device having physical attributes that can be modeled. Describing the physical component by defining a model element can include programmatically, computationally, mathematically and/or behaviorally defining the model element. Connections to the model element describing the physical component can be non-directional or non-causal. The physical component and its associated physical behavior may be functionally defined. Therefore, the structure of the physical component as represented by the model element can be defined at compile time based on parameters and behavior statements. The structure of the physical component may also vary before, during, or after model execution. For example, the structure may be configured by a user or by an automated script, and may be altered prior to simulation, or may change during simulation.

As previously noted, the physical component's reliability can be represented by one or more characteristics or properties of the model component with which it is associated. Reliability information can be a characteristic, feature, property, or other definable portion of the physical component. Behavioral characteristics, such as component reliability, can be described from first principles, and described by mathematical equations, operating condition dependent ranges, or the like. The combination of the structural physical parameter with the behavioral features forms the model component that models the physical component of the physical network. Because the physical network can be described by one or more physical components, each having one or more structural and behavioral physical features, there can likewise be one or more model components in the model associated with each physical component of the physical network.

In addition to the graphically-based modeling environments noted above, TCE's may be implemented as a text-based environment (e.g., MATLAB® software; Simscape™ (using textual/composite components); Octave; Python™; Comsol Script; MATRIXx from National Instruments; Mathematica from Wolfram Research, Inc.; Mathcad from Mathsoft Engineering & Education Inc.; Maple from Maplesoft; Extend from Imagine That Inc.; Scilab from The French Institution for Research in Computer Science and Control (INRIA); Virtuoso from Cadence; Modelica or Dymola from Dynasim; etc.); aspects of a Unified Modeling Language (UML) or SysML environment; etc.); or another type of environment, such as a hybrid environment that includes one or more text-based environments and one or more graphically-based environments.

III. EXAMPLE DEVICE ARCHITECTURE

Figure 3:
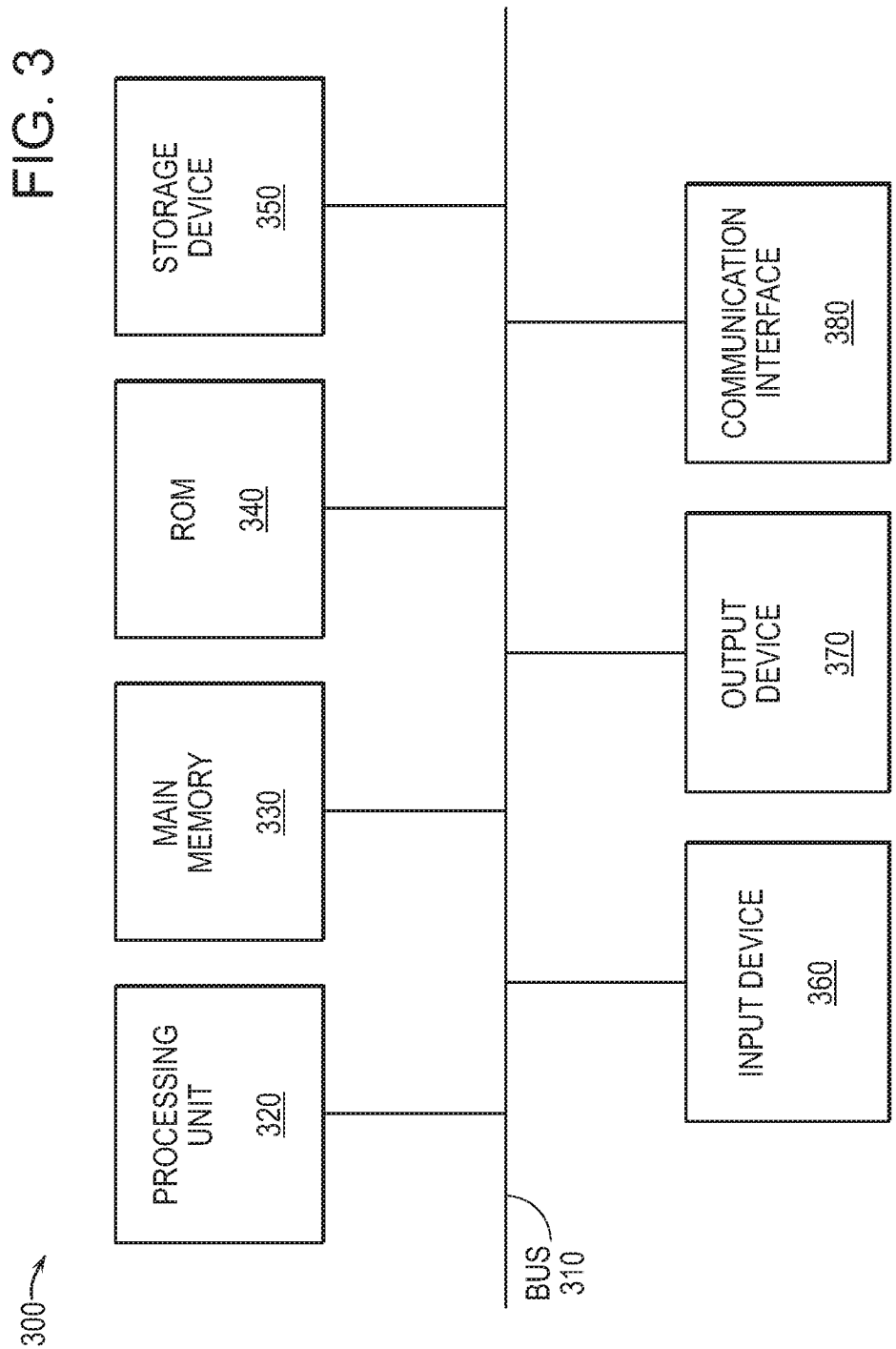
FIG. 3 is a diagram of example components of one or more of the devices of the environment depicted in FIG. 2.

FIG. 3 is an example diagram of a device 300 that may correspond to one or more of the devices of environment 200. As illustrated, device 300 may include a bus 310, a processing unit 320, a main memory 330, a read-only memory (ROM) 340, a storage device 350, an input device 360, an output device 370, and/or a communication interface 380. Bus 310 may include a path that permits communication among the components of device 300.

Processing unit 320 may include one or more processors, microprocessors, or other types of processing units that may interpret and execute instructions. Main memory 330 may include one or more random access memories (RAMs) or other types of dynamic storage devices that may store information and/or instructions for execution by processing unit 320. ROM 340 may include one or more ROM devices or other types of static storage devices that may store static information and/or instructions for use by processing unit 320. Storage device 350 may include a magnetic and/or optical recording medium and its corresponding drive.

Input device 360 may include a mechanism that permits a user to input information to device 300, such as a keyboard, a camera, an accelerometer, a gyroscope, a mouse, a pen, a microphone, voice recognition and/or biometric mechanisms, a remote control, a touch screen, a neural interface, etc. Output device 370 may include a mechanism that outputs information to the user, including a display, a printer, a speaker, etc. Communication interface 380 may include any transceiver-like mechanism that enables device 300 to communicate with other devices, networks, and/or systems. For example, communication interface 380 may include mechanisms for communicating with another device or system via a network.

As described herein, device 300 may perform certain operations in response to processing unit 320 executing software instructions contained in a computer-readable medium, such as main memory 330. A computer-readable medium may be defined as a non-transitory memory device. A memory device may include space within a single physical memory device or spread across multiple physical memory devices. The software instructions may be read into main memory 330 from another computer-readable medium, such as storage device 350, or from another device via communication interface 380. The software instructions contained in main memory 330 may cause processing unit 320 to perform processes described herein. Alternatively, hardwired circuitry may be used in place of or in combination with software instructions to implement processes described herein. Thus, implementations described herein are not limited to any specific combination of hardware circuitry and software.

Although FIG. 3 shows example components of device 300, in other implementations, device 300 may include fewer components, different components, differently arranged components, and/or additional components than depicted in FIG. 3. Alternatively, or additionally, one or more components of device 300 may perform one or more other tasks described as being performed by one or more other components of device 300.

Figure 4:
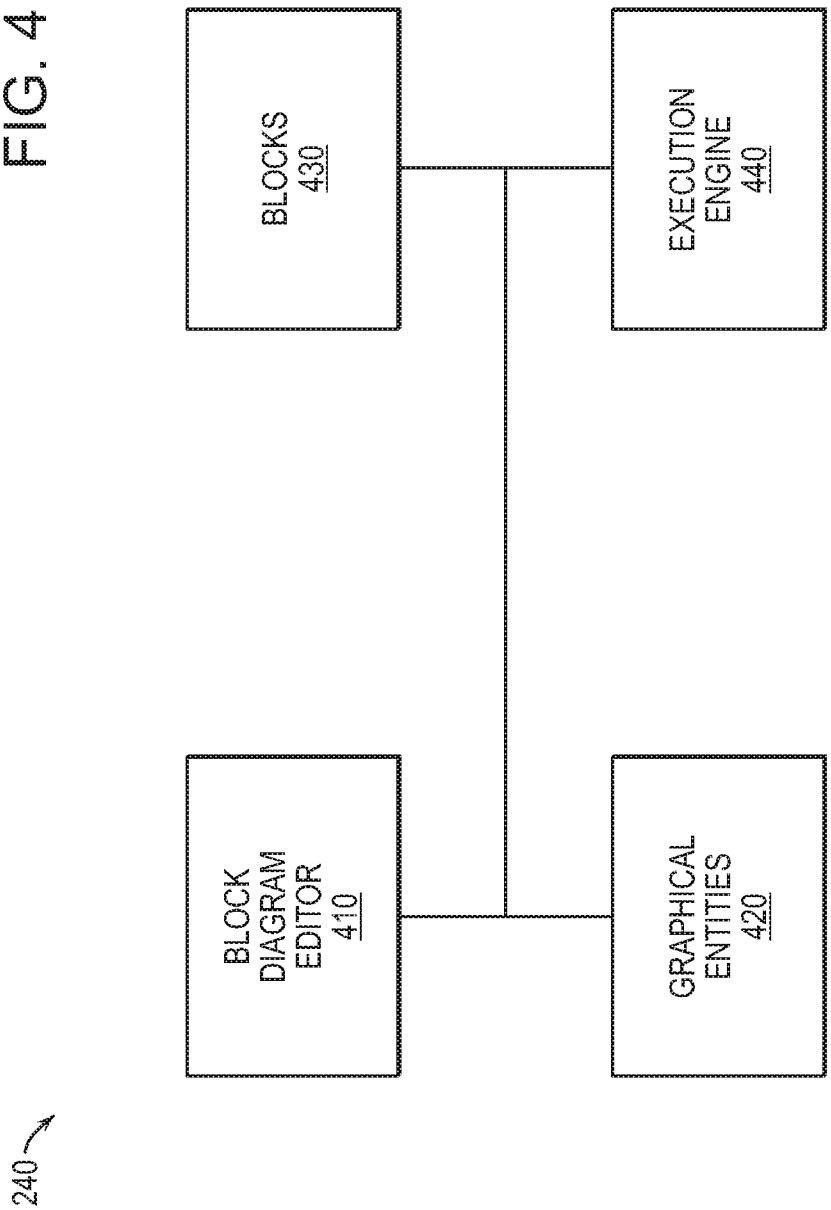
FIG. 4 is a diagram of example functional components of a technical computing environment (TCE) that may be used by one or more of the devices of the environment depicted in FIG. 2.

FIG. 4 is a diagram of example functional components of TCE 240. In one implementation, the functions described in connection with FIG. 4 may be performed by one or more components of device 300 (FIG. 3) and/or by one or more devices 300. As shown in FIG. 4, TCE 240 may include a block diagram editor 410, graphical entities 420, blocks 430, and/or an execution engine 440.

Block diagram editor 410 may include hardware or a combination of hardware and software that may be used to graphically specify models of dynamic systems. In one implementation, block diagram editor 410 may permit a user to perform actions, such as construct, edit, display, annotate, save, and/or print a graphical model (e.g., a block diagram that visually and/or pictorially represents a dynamic system). In another implementation, block diagram editor 410 may permit a user to create and/or store data relating to graphical entities 420.

A textual interface may be provided to permit interaction with block diagram editor 410. For example, a user may write free-form text, such as scripts, that perform automatic editing operations on a model using the textual interface. For example, the textual interface may provide a set of windows that may act as a canvas for the model, and may permit user interaction with the model. A model may include one or more windows depending on whether the model is partitioned into multiple hierarchical levels.

Graphical entities 420 may include hardware or a combination of hardware and software that may provide entities (e.g., signal lines, buses, physical connections, etc.) that represent how data may be communicated between functional and/or non-functional units and blocks 430 of a model. Blocks 430 may include fundamental mathematical elements of a block diagram model.

For example, blocks 430 may include graphical representations, such as squares, rectangles, circles, etc., for representing mathematical elements included in a model. The graphical representations may comprise program code and have executable semantics that cause functionality of the mathematical elements to be implemented when the model is executed, e.g., simulated behavior of the components are exhibited. The components may comprise sources or sinks, in which case they might only have an output or input, respectively. Components with physical ports only may represent network components that define physical constraints at their ports (e.g. voltages, pressures and temperatures).

Execution engine 440 may include hardware or a combination of hardware and software that may process a graphical model to produce simulation results, may convert the graphical model into executable code, and/or may perform other analyses and/or related tasks on behalf of one or more models. In one implementation, for a block diagram graphical model, execution engine 440 may translate the block diagram into executable entities (e.g., units of execution) following the layout of the block diagram. The executable entities may be converted into intermediate representations, compiled and/or executed on a device (e.g., client device 210) to implement the functionality specified by the model.

Graphical models may include model components having relationships with other model components, and the relationships and/or the model components may have attributes associated with them. The relationships may include model elements such as connector lines and references. The attributes may include value information and meta information for the model component associated with the attributes. Graphical models may be associated with configuration information. The configuration information may include information for the graphical model such as model execution information (e.g., numerical integration schemes, fundamental execution period, etc.), model diagnostic information (e.g., whether an algebraic loop should be considered an error or result in a warning), model optimization information (e.g., whether model elements should share memory during execution), model processing information (e.g., whether common functionality should be shared in code that is generated for a model), etc.

Additionally, or alternatively, a graphical model may have executable semantics and/or may be executable. An executable graphical model may be a time based block diagram. A time based block diagram may consist, for example, of blocks (e.g., blocks 430) connected by lines (e.g., connector lines). The blocks may consist of elemental dynamic systems such as a differential equation system (e.g., to specify continuous-time behavior), a difference equation system (e.g., to specify discrete-time behavior), an algebraic equation system (e.g., to specify constraints), a state transition system (e.g., to specify finite state machine behavior), an event based system (e.g., to specify discrete event behavior), etc. The lines may represent signals (e.g., to specify input/output relations between blocks or to specify execution dependencies between blocks), variables (e.g., to specify information shared between blocks), physical connections (e.g., to specify electrical wires, pipes with volume flow, rigid mechanical connections, etc.), etc. The attributes may consist of meta information such as sample times, dimensions, complexity (whether there is an imaginary component to a value), data type, etc. associated with the model elements.

In a time based block diagram, ports may be associated with blocks (e.g., blocks 430). A relationship between two ports may be created by connecting a line (e.g., a signal line) between the two ports. Signals correspond to the time-varying quantities represented by each signal line connection and are assumed to have values at each time instant. The source block of a signal writes to the signal at a given time instant when its system equations are solved. The destination blocks of this signal read from the signal when their system equations are being solved. Lines may also, or alternatively, be connected to other lines, for example by creating branch points. For instance, three or more ports can be connected by connecting a line to each of the ports, and by connecting each of the lines to a common branch point for all of the lines. A common branch point for the lines that represent physical connections may be a dynamic system (e.g., by summing all variables of a certain type to 0 or by equating all variables of a certain type). A port may be an input port, an output port, an enable port, a trigger port, a function-call port, a publish port, a subscribe port, an exception port, an error port, a physics port, an entity flow port, a data flow port, a control flow port, etc.

Relationships between blocks (e.g., blocks 430) may be causal and/or non-causal (acausal). For example, a model may include a block that represents a continuous-time integration block that may be causally related to a data logging block by using a line (e.g., a connector line) to connect an output port of the continuous-time integration block to an input port of the data logging block. Further, during execution of the model, the value stored by the continuous-time integrator may change as the current time of the execution progresses. The value of the state of the continuous-time integrator may be available on the output port, and the connection with the input port of the data logging block may make this value available to the data logging block. For an example of an acausal relationship, consider orifice block 525 and chamber block 530. Chamber block 530 may utilize a differential equation that defines chamber pressure, and a flow into chamber block 530 from the orifice block 525 may ramp up the pressure. At the same time, the orifice block 525 may utilize an equation that determines the flow rate through the block (as the name implies, a through variable.) This equation may depend on the adjacent chamber pressure, which may be held equal to orifice outlet pressure via the node constraint (an across variable). Physical components may be represented using this type of acausal modeling, with the ability of the execution engine 545 to monitor, detect, log and react to failure behaviors in acausal component definitions.

Execution engine 545 has knowledge of model element nominal behaviors (e.g., from user and/or automated specifications, etc.) and the failure modes that exist for the model elements (e.g., blocks, labels, lines, annotations, etc.). Execution engine 545, therefore, has an ability to monitor, detect, log and respond to, for example, model elements during simulation that are operating in, or deviating from, defined "normal" ranges. If execution engine 545 detects faulty behavior by one or more model element(s), execution engine 545 may take responsive actions, including for example generating code (e.g., executable entities, etc.) for initiating logging and/or reporting operations, creating fault tree(s), launching a failure mode effects analysis and/or compiling system level reliability information, etc.

A sample time may be associated with the elements of a graphical model. For example, a graphical model may include a block (e.g., block 430) with a continuous sample time, such as a continuous-time integration block that may integrate an input value as a time of execution progresses. This integration may be specified by a differential equation. During execution, the continuous-time behavior may be approximated by a numerical integration scheme that is part of a numerical solver. The numerical solver may take discrete steps to advance the execution time, and these discrete steps may be constant during an execution (e.g., fixed step integration) or may be variable during an execution (e.g., variable-step integration).

Whereas execution engine 440 may be used to simulate causal (e.g. block 430) or signal-based system models, execution engine 545 may be capable of simulating acausal or mixtures of causal and acausal blocks and sub-systems. Acausal blocks may be continuous time and defined by differential equations, e.g., current through a capacitor is equal to a constant times the rate of change of voltage across it. As for causal systems, numerical integration may be used to approximate behavior, but with the added complexity of constraints between variables (e.g., all component nodes connected to each other are at the same potential), including differential constraints (e.g., two capacitors connected in parallel define two differential variables which essentially define the same voltage variable). Solving these types of equations may involve additional steps to manage constraints and specialist solvers (e.g., implicit solvers) can be used for better simulation performance.

Many systems comprise both physical parts (motors, pumps, gears, etc.) and algorithmic parts (digital controllers, fault detection code, etc.), and may be modeled with a mixture of causal and acausal blocks. One possible implementation manages the causal and acausal parts separately, with an execution engine 440 handling the causal or algorithmic part, and an execution engine 545 the acausal part, reporting physical system boundary states at a fixed discrete sampling rate to the 440 execution engine. This suits applications where the causal part is all discrete time, i.e., all algorithmic. In another implementation, a single execution engine 545 handles both causal and acausal parts.

Alternatively, or additionally, a graphical model may include a block (e.g., block 430) with a discrete sample time such as a unit delay block that may output values of a corresponding input after a specific delay. This delay may be a time interval, and this interval may determine a sample time of the block. During execution, the unit delay block may be evaluated each time the execution time has reached a point in time where an output of the unit delay block may change. These points in time may be statically determined based on a scheduling analysis of the graphical model before starting execution.

Alternatively, or additionally, a graphical model may include a block (e.g., block 430) with an asynchronous sample time, such as a function-call generator block that may schedule a connected block to be evaluated at a non-periodic time. During execution, a function-call generator block may evaluate an input, and, when the input attains a specific value when the execution time has reached a point in time, the function-call generator block may schedule a connected block to be evaluated at this point in time and before advancing execution time.

Further, the values of attributes of a graphical model may be inferred from other elements of the graphical model or attributes of the graphical model. For example, the graphical model may include a block (e.g., block 430), such as a unit delay block, that may have an attribute that specifies a sample time of the block. When a graphical model has an execution attribute that specifies a fundamental execution period, the sample time of the unit delay block may be inferred from this fundamental execution period.

As another example, the graphical model may include two unit delay blocks (e.g., blocks 430) where an output of the first of the two unit delay blocks is connected to an input of the second of the two unit delay block. The sample time of the first unit delay block may be inferred from the sample time of the second unit delay block. This inference may be performed by propagation of model element attributes such that, after evaluating a sample time attribute of the second unit delay block, a graph search proceeds by evaluating a sample time attribute of the first unit delay block since the first unit delay block is directly connected to the second unit delay block.

The values of attributes of a graphical model may be set to characteristics settings, such as one or more inherited settings, one or more default settings, etc. For example, the data type of a variable that is associated with a block (e.g., block 430) may be set to a default, such as a double. Because of the default setting, an alternate data type (e.g., a single, an integer, a fixed point, etc.) may be inferred based on attributes of elements that the graphical model comprises (e.g., the data type of a variable associated with a connected block) and/or attributes of the graphical model. As another example, the sample time of a block may be set to be inherited. In the case of an inherited sample time, a specific sample time may be inferred based on attributes of elements that the graphical model comprises and/or attributes of the graphical model (e.g., a fundamental execution period).

Although FIG. 4 shows example functional components of TCE 240, in other implementations, TCE 240 may include fewer functional components, different functional components, differently arranged functional components, and/or additional functional components than depicted in FIG. 4. Alternatively, or additionally, one or more functional components of TCE 240 may perform one or more other tasks described as being performed by one or more other functional components of TCE 240.

IV. EXAMPLE RELIABILITY ENGINEERING OPERATIONS

Some advanced design simulation software tools (such as the aforementioned MATLAB®, Simulink® and Simscape™ from The Mathworks, Inc.) offer verification and validation features that help users test and qualify algorithms (e.g., feedback controllers, etc.) for running on real-time hardware in the context of safety-critical systems (e.g., flight training simulators, etc.). The methods and systems described herein permit reliability information, including tolerances, failure behavior, failure state triggers and/or operating limits to be built into blocks of block diagrams utilized by such simulation software tools.

For example, the implementations described herein permit definition of a single system model that does not require time-consuming and user-knowledge dependent manual editing or other additional revising to analyze all possible failure cases. A single model may be created that accounts for the collective impact of the reliability parameters of the system and its components. Another capability is the ability to derive datasheet information and generate datasheets for components, sub-systems, and or entire systems. For example, a system-level datasheet may be presented as a set of performance characteristics derived from the system using the execution engine 545 plus constraints on permissible external conditions such as temperature. Another analysis capability is the ability to automatically predict emergent failures, through simulated stressing of the system and monitoring the impact of degraded behavior of particular components or groups of components on one another or the system as a whole. Deductions can be drawn about overall system performance from a combination of assumed/known component data and a dynamic simulation model. A recursive simulation algorithm may permit identification of all fault combinations that cause the modeled system to fail, which may then be extracted to build fault trees.

With reference again to FIG. 1, in certain implementations, TCE 240 may connect a model 160 with code that is executing externally (e.g., VHSIC hardware description language (VHDL) code on a target processor 170 synthesizing a programmable hardware device) to enable a processor-in-the-loop configuration, hardware-in-the-loop (HIL) configuration, software-in-the-loop configuration, or model-in-the-loop configuration. A VHDL may be used to precisely describe the structure and behavior of electronic circuits (most commonly, digital logic circuits), enabling automated analysis, simulation, and the synthesis of a VHDL description into a netlist (a specification of physical electronic components and how they are connected together), which can then be placed and routed to produce the set of masks used to create an integrated circuit. The executable code may generate variable information that may be stored in a logical workspace and/or presented for display via a user interface associated with the logical workspace. Faults may be triggered based on probability, specific timing, external influences (e.g., user misuse of connected physical hardware 180, such as a flight simulator), and/or faults injected from the external hardware 180 and/or system, with design and qualification of physical parts as well as algorithmic parts. HIL simulation is typically performed in real-time in that non-simulated, e.g., actual, physical components and/or systems are operating in the physical world along with the HIL code 160 running on the target processor 170.

V. EXAMPLE MODEL SYSTEMS AND MODEL COMPONENTS

TCE 240 permits parameterization of blocks 115A-115C (e.g., model components) of block diagram system model 110 with reliability information associated with the physical components that the blocks represent, such as parameter tolerances, performance ratings, operating limits, and recoverable or non-recoverable fault dynamics conditions. Recoverable or non-recoverable fault dynamics conditions refer to parameters influencing whether a model component, a group of model components, or a system comprised of model component conform to nominal operation, and/or whether faulted behavior can be expected to return to nominal operation. For example recoverable or non-recoverable fault dynamics conditions may include triggers and/or dependencies of the nominal values/tolerances on probabilistic (e.g., system/component aging, extreme environmental conditions) failure modes, stochastic failure modes (e.g., based on random probability distribution not precisely predictable), and/or state(s) of adjacent component(s), user misuse, etc. For example, reliability parameters may define the effect of temperature on an electrical component's impedance, conditions under which the component fails catastrophically, definition of ensuing failed-state behavior, and conditions under which recovery is possible, etc. Such information may be acquired (manually or automatically) from previously created libraries, or be extracted from the components' supplier datasheets. The blocks may include linking data that map back to the supplier datasheet, so that traceability of data is possible. In addition, for design optimization, components might capture cost information, e.g., sensitivity of cost to component tolerance level.

As previously noted, failed behavior does not necessarily mean catastrophically failed behavior. Example dialog boxes that might be generated by TCE 240 to permit entry and/or editing of the reliability parameters that control the behavior of the blocks 115A-115C will now be described. During simulation, non-conforming behavior may be detected by monitoring conditions/signals at the measuring points 125.

Figure 6:
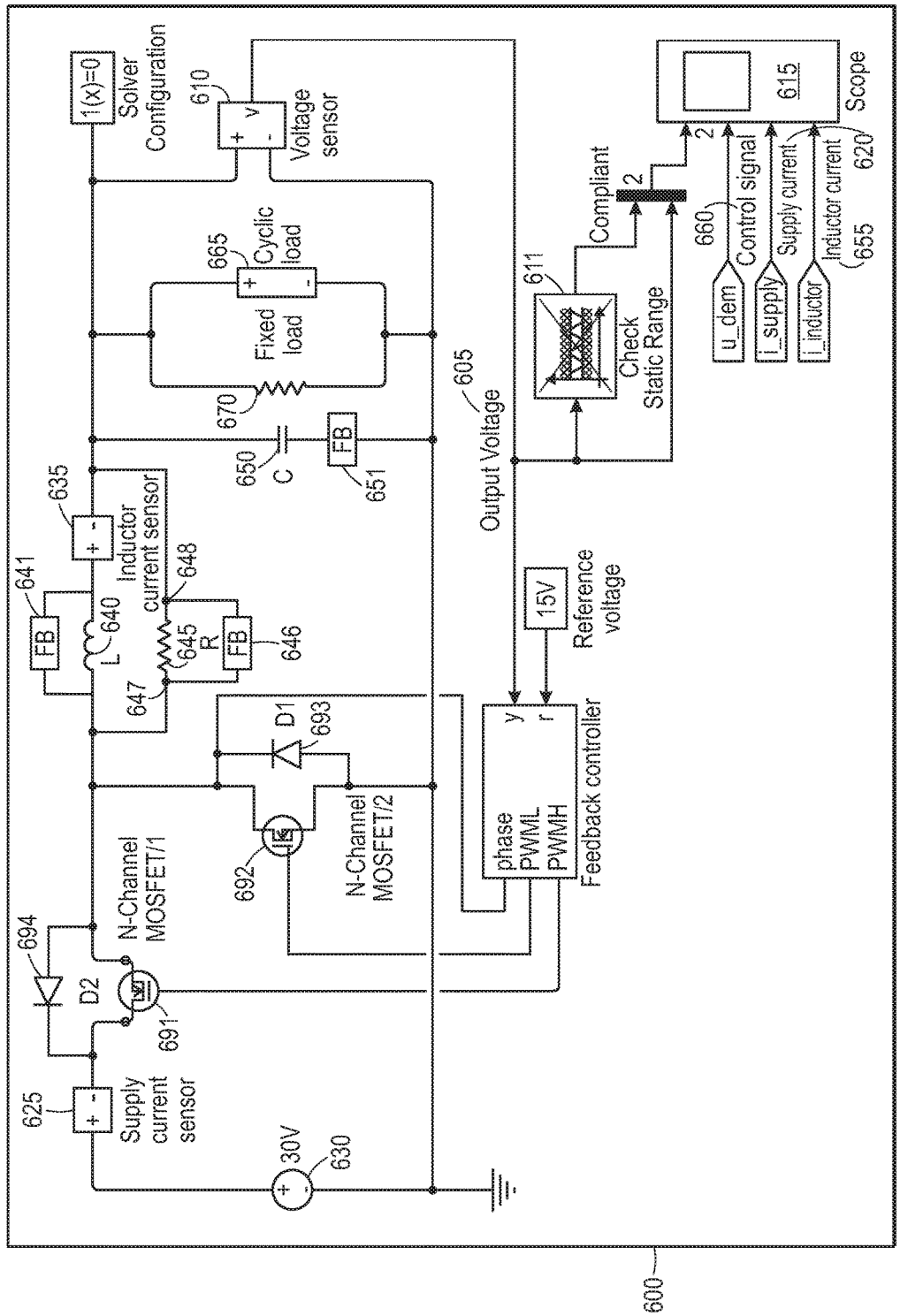
FIG. 6 is an illustration of a modeled regulated power supply circuit.

FIG. 6 is an example block diagram model 600 representing a DC-DC power converter that regulates an output voltage 605 of the circuit to be 15 volts, given some unregulated input supply 630, nominal value 30 volts. In the example, a cyclic 1 amp load 665 turns on at 1.5 milliseconds and cycles on/off every 0.5 milliseconds, and the fixed load 670 draws 4 amps. A supply current 620 from input supply 630 is measured during simulation by a measurement point, supply current sensor 625. The output voltage 605 is measured by another measurement point, voltage sensor 610. Inductor current 655 from inductor block 640 is measured at current sensor 635. Either or both of these signals over the simulation may be viewed with a scope block 615.

The block diagram model 600 may be used to assess the impact of component tolerances and fault events on the operation of a switching power supply. The resistor block 645, inductor block 640 and capacitor block 650 all may have defined tolerances, operational limits, and faults. FIGS. 7A-7C, 8A-8C and 9A-9C illustrate example component parameterization dialog boxes of a TCE used to parameterize, respectively, resistor block 645 and its fault block 646, inductor block 640 and its fault block 641, and capacitor block 650 and its fault block 651, of block diagram model 600. In order to set or invoke a fault in any of the component blocks, its respective parameterization dialog box 700, 800, 900 can be opened, and on the Faults tab 710, 810, 910 the Enable faults parameter 705, 805, 905 can be set to "Yes".

As shown in FIG. 9C, an enabled fault may have numerous associated definable parameters, depending upon the nature of the physical component being modeled, relating to recoverable and non-recoverable fault behavior dynamics. Establishing common reliability parameters (e.g., tolerance application 715, 815, 915, tolerance distribution 720, 820, 920, etc.) permits analysis methods used by the TCE to search and act on all similar parameters collectively, if so desired. In some situations (e.g., sets of resistors) it may be uncommon for model component tolerances to be correlated. In some cases, a simulation run may take a model component outside normal operating conditions, impacting its tolerance values. In such cases, the TCE may advise a user this has occurred, and/or TCE may automatically update the affected tolerance values. It will be readily appreciated by those of skill in the art that the use of distinct generic fault blocks is only one implementation, and that other approaches are possible. For example, in an alternate implementation, distinct generic fault blocks might not be used. Instead, when a fault occurs in a physical component, the TCE and model 600 may replace the equation(s) used to model the "normal" behavior of a physical component with equation(s) representing fault condition operation.

An execution engine of the TCE (such as execution engine 540 shown in FIG. 5) interrogates and exercises model 600. Execution engine 540 may include, for example, a MATLAB® or Simulink™ API, in the context of those computing environments. The execution engine 540 may search the system model 600 for all faults, distinguishing between deterministic and statistical failures, etc. The execution engine 540 may execute the model 600 in order to determine whether any of the faults, alone or in combination, results in system failure. Tests may be performed recursively to evaluate multiple fault conditions, and present the results of such simulations to a system-level fault tree. If model components have information on statistical fault probabilities, such information may be added as annotation(s) on the fault tree, for engineering review and automated calculation of system reliability or mean time between failures (MTBFs.)

The execution engine 540 may, for each deterministic fault present among the model components, identify how a behavioral condition or change in one or more other model components may trigger a change in the behavior of a particular model component. This information may contribute to the operating limits for a whole-system datasheet. Monte Carlo techniques may be employed to test for conditions that trigger deterministic faults and/or conditions that trigger emergent failures, such as system instability, limit cycling, power supply limit violations, etc.

The execution engine 540 may communicate the results of the overall system model performance and reliability. One output of such a method may be a datasheet for the overall system (and possibly also subsystems within the overall system), which may be analogous to, or different than, the datasheets used by component suppliers.

The model component reliability information may include implementing equations that define the dependency of deterministic faults on the model component's state and/or the state(s) of the system or model component(s) immediately adjacent to it. This lets deterministic faults be triggered behaviorally rather than being artificially injected into a simulation. As new components are made available to users of the system, such equations may be generated for the new components, consistent with their associated data sheets and the formats that users expect to see.

Component blocks may capture statistical fault probability failure information, which may define how this probability depends on component state and the state of the system in which its associated model component is connected, or another system influencing in an external manner the associated component or its system. This feature supports worst-case fault-tree analysis, whereby the simulation model may be exercised to find worst case component failure probabilities.

In certain implementations, three modes of failure may be considered. First, a model component may exceed its operating limit due to unanticipated system conditions (e.g., current or temperature exceeds respective limit for a length of time). Second, a statistical failure mode of a model component may be specified, such as a MTBF. Third, an emergent system property failure may occur due to either of the preceding failure modes. For example, the system may become unstable, a performance requirement may no longer be met, the sum of loads may grow larger than the sources of power, the system temperature may rise or fall outside permissible ranges, etc. Emergent properties may be associated with a smallest part of the system or subsystem, in order to support fault tree analysis. As previously noted, faults can be permanent or transient.

A model component failure may be triggered by one or more events, such as a deterministic fault that occurs predictably as function of model variables and/or simulation time, a statistically distributed fault with fixed probability, and/or a statistically distributed fault with variable probability. The aforementioned probabilities may depend on model variable values, including fault state of other components. The failure types depend upon the particular physical component being modeled, but some generalizations for the class of electrical components is possible, such as a) Failing open-circuit, or stuck open fault.
b) Failing short-circuit, or bridging fault.

c) Failing with new impedance or behavior.
d) Stuck at fault e.g. stuck to $V_{cc}$.
e) Delay fault.
f) Aging effects, e.g., frequency changes.

Frequency of statistical faults may generally be defined, including
- a) Fault density: (more directed to logic/computer systems) defining a number of faults per unit of data e.g. faults per GByte.
- b) Failure rate: rate at which faults take place. Denoted λ, units are number of faults per thousand operating hours (fault/$10^3$ hours).
- c) Mean time-to-failure (MTTF): estimate of the mean time expected until the first fault occurs. MTTF=1/Failure rate for constant failure rates.
- d) Mean time-to-repair (MTTR): time elapsed between a fault occurrence and its repair.
- e) MTBF: time elapsed before a component experiences another fault. Similar to MTTF, but includes MTTR. Mostly only used for constant failure rates. This may be expressed as a vector that changes values based on repeated or multiple fault conditions occurrences.

Several non-limiting examples will now be described in greater detail for modeling electrical components with reliability information.

Figure 7A:
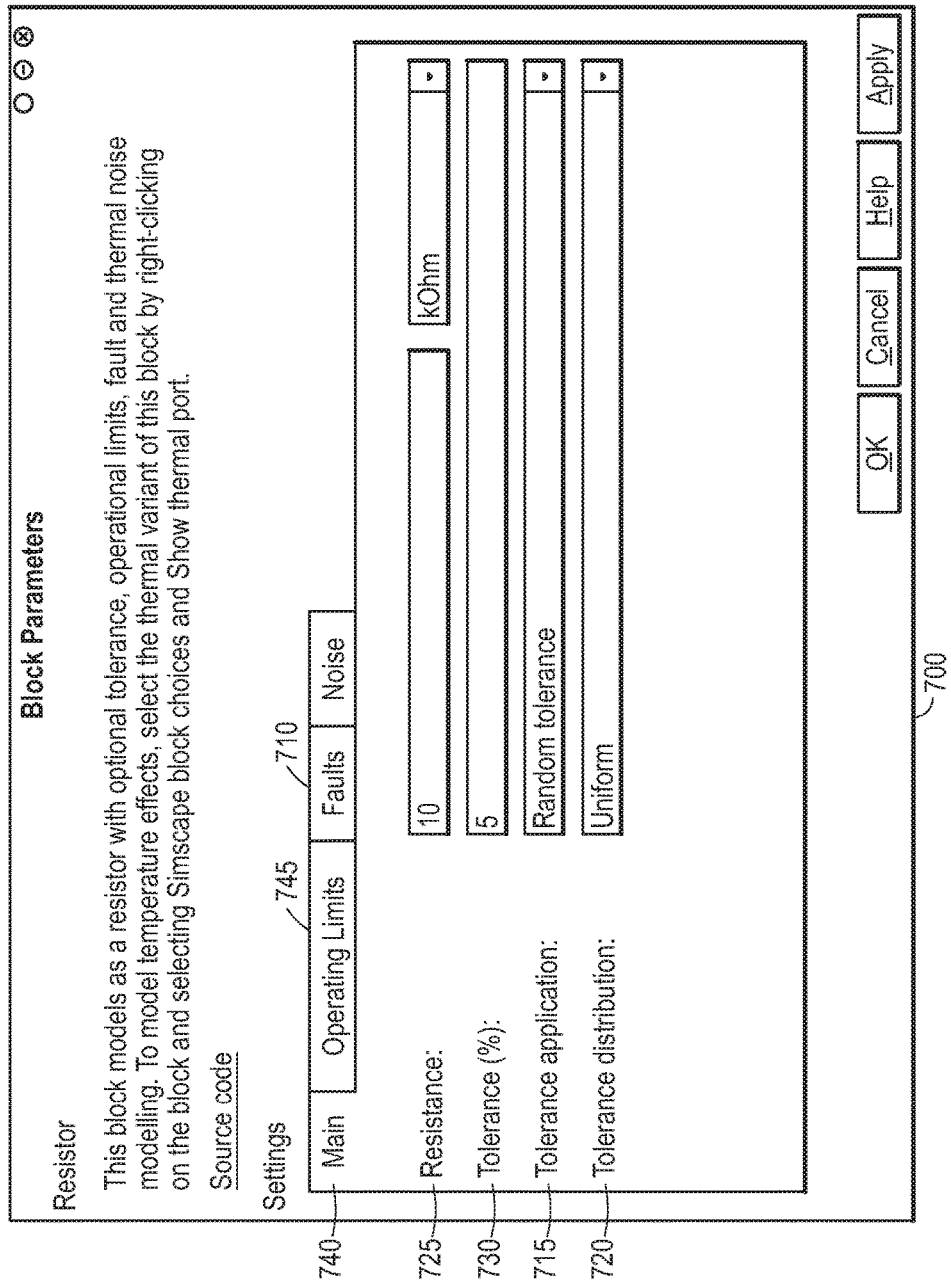

With reference again to FIG. 6, a physical resistor may be modeled as a resistor block 645 and an associated generic fault block 646, such as shown in FIG. 6 (two blocks are shown for clarity, but a single block could suffice). FIG. 7A illustrates example TCE dialog box for Main tab 740 for viewing and/or editing resistor reliability parameters, including a nominal resistance value 725, tolerance range 730, tolerance application 715 and tolerance distribution 720. FIGS. 7B and 7C illustrate, respectively, example TCE dialog boxes for Operating Limits tab 745 and Faults tab 710 (no screenshot is shown for Thermal Noise tab 711). As previously described, faults may be enabled or not (e.g., by setting Enable faults parameter 705 on the Faults tab 710). Inductor Faults tab 905 (as shown in FIG. 9C) illustrates how additional reliability parameters may be defined and set, such as actions to be taken, if any, to report when a fault occurs, temporal triggers, behavioral triggers (e.g., a permissible voltage or current range), and external triggers (a monitored external parameter value compared against a set threshold).

Fault blocks may allow a user to represent an electrical fault as an instantaneous change in resistance, capacitance, and/or inductance. In some implementations, fault events may generally be triggered at a specific time, and/or after a predefined operating condition (e.g., a current and/or voltage limit) is exceeded for specified length of time, either of which may be statistically-based. The generic fault block may be designed for use with other existing blocks that do not yet model reliability, and may be used to replicate both open-circuit and short-circuit fault behaviors. Fault events may also be triggered when an external trigger signal goes high or low. Optionally, the external trigger option also permits the fault be reset when the trigger signal reverts. Trigger mechanisms can be separately enabled or disabled, and used together if more than one trigger mechanism is required in a simulation. There may be faults from which a model component may recover. For such cases, a fault reset time or monitored fault condition threshold may be defined.

For a generic fault, when no fault is triggered, the resistance between the two electrical ports 647,648 may be set to the fault non-enabled (unfaulted) resistance parameter value, the default value for which may be substantially infinite ohms, i.e., the ports 647,648 of the resistor block 645 simulate an open circuit. When a fault is triggered, the resistance between the two electrical ports 647,648 is changed to the faulted resistance value, the default value for which may be, for example, $10^{-3}$ ohms, i.e., the ports are short circuited. A user may choose whether to issue an assertion signal (that might affect behavior of other model components) when a fault occurs. Output from the fault block 646 may also be needed to let a user modify other faults based on the instant fault. A fault occurrence may have the selectable options of taking no action (and continuing the simulation), warning that a fault has occurred, and stopping the simulation, and generating an error. In some implementations, it may be desirable to count the number of times a fault condition is encountered. Such information could be made available in the model, for example as a block output.

As with any model component, an initial step of the process may be to gather whatever reliability information that is available from the resistor's datasheet, which may include the failure modes. A user may revise the ways to invoke these failure modes. An example table of resistor datasheet parameters and associated use cases may be created as shown in the following table:

| Parameter | Use case 1: warn/error | Use case 2: behaviour change | Use case 3: Monte Carlo |
|---|---|---|---|
| Power rating - often quoted at 70° C. (P70). De-rating curve for power rating at higher temperatures (percent rated load @ temperatures). | Warn or error when exceeded - counts as a failure case | | |
| Short-term overload: permanent resistance change following application of 2.5 times power rating for 5 seconds. | | Update nominal resistance value during simulation. | |
| Resistance tolerance | | | Apply tolerance at simulation start (options of repeatable, random, and edge cases). |
| Temperature coefficient tolerance | | | Apply tolerance at simulation start (options of repeatable, random, and edge cases). |

-continued

| Parameter | Use case 1: warn/error | Use case 2: behaviour change | Use case 3: Monte Carlo |
|---|---|---|---|
| Operating temperature | Warn or error when exceeded - counts as a failure case | | |
| Load life e.g. ±1% after 1000 hours at rated load. Life at elevated temperature e.g. ±3% after 1000 hours no load. Moisture resistance e.g. ±1% 95% RH after 1000 hours. | | Update nominal resistance as function of time and load. Update nominal resistance value during simulation. | Include in tolerance calculation at simulation start. |
| Soldering e.g. 10 s, 260° C. ±1% R + 0.05 ohms | | | Include in tolerance calculation at simulation start. |
| Maximum working voltage e.g. min(50, sqrt(power_rated * R)) | Warn or error when exceeded - counts as a failure case | | |
| Maximum overload voltage e.g. min(100, 2.5 * sqrt(power_rated * R)) | Warn or error when exceeded - counts as a failure case | Change resistance value during simulation - user specifies new value e.g. open-circuit. | |

Note that the tolerance calculation on the resistance value at simulation start depends potentially on numerous considerations (e.g., nominal tolerance, moisture content, soldering, previous loading, etc.). A user may be prompted to specify event triggers (e.g., at a particular simulation time, or due to a user-defined probability/random distribution, or from function of other model variables) and new component behaviors following the event (e.g., open-circuit, short-circuit, new resistance value, or a completely different behavior such as behavior as a diode).

FIG. 7A illustrates the Main tab 740 for specifying a percentage resistance tolerance value. In simulation, there may be options for applying the tolerances that support both Monte Carlo simulation and worst case search analysis. Tolerance application 715 may be used to define whether the tolerance is randomly applied (a further drop-down may be presented, if random is selected, to define repeatability), or selected to be at nominal or min/max values, or follow an equation, may all be controllable. Optionally, the user may apply tolerances to the nominal value provided for the resistance parameters. Datasheets typically provide a tolerance percentage for a given resistor type. To choose how this tolerance is applied when simulating, selection may be made among: none; random; max; and min tolerance values, for example.

FIG. 7B illustrates the Operating Limits tab 745, using which a user may select whether to model operating limits or not. If enabled, then when a limit is reached, the simulation may generate a warning and continue, or stop and error, or pause and debug, etc. The first option supports, for example, the case where exceeding an operating limit does not imply immediate component failure, so the simulation can proceed, and an assessment may be made on impact on other failures, e.g., to increased temperature. Another option would be to invoke the fault state equations when an operating limit is exceeded (e.g., assumes immediate component failure). Default operating parameters may also be set. Options available through the Operating Limits tab may include, among others: power rating; derating (percent, vector, or single point); temperature vector for derating data (same size as derating vector); action if power rating exceeded—select between following—None|Warn|Pause|Error; max working voltage; action if max working voltage exceeded—select between following—None|Warn|Pause| Error.

FIG. 7C illustrates the Faults tab 710, through which a user can choose whether to stop a simulation when a fault or other behavior trigger occurs, or continue, e.g., to determine if this fault causes subsequent top-level system failure, or if it is caught and managed by a failure detection and isolation algorithm. Options available through the Fault tab (some of which are illustrated in FIG. 9C) may include: fault trigger type (time-based fault event, statistical-based fault event); fault times (default is infinite); fault reset times; MTBF (default infinite, may be a vector to define changed value if multiple failures are occurring); mean time between resets; failure current; and time to fail.

In some implementations, a Thermal Port tab 711, such as shown in FIG. 7D, which if selected exposes the thermal port on the resistor block 645, presents thermal dependence parameters for viewing and editing. Thermal mass, initial temperature, dissipated power vector, and thermal time constants are among possible resistor component parameters. The thermal port variant of the blocks makes use of temperature. Hence, if a user wants to make use of the derating curve, they may expose the thermal port and add a suitable thermal model. Alternatively a third thermal option could be implemented across all blocks with optional thermal ports with description "Internal thermal model". Operating Limits tab 745A now shows additional parameters that determine how the operating limit ranges for the resistor may be reduced as temperature increases.

Emergent properties based on behavior of more than one block may be detected by the execution engine 545, and/or may be defined by custom blocks that measure during simulation key operating parameters and fault signals, and which may generate warnings (without stopping the simulation) or errors (stopping simulation.), or which may simply be checked after a simulation.

FIG. 9A illustrates example TCE dialog box for Main tab 940 for inductor reliability parameters, including a nominal inductance value 925, tolerance range 930, tolerance application 915 and tolerance distribution 920. FIGS. 9B and 9C illustrate, respectively, example TCE dialog boxes for Operating Limits tab 945 and Faults tab 910. An example inductor model component may include the following reliability parameters:

a) Tolerances—an inductance value, typically in the range of 20%
b) Operating Limits—maximum current, temperature range (if thermal port is modeled)
c) Temperature Dependence—datasheets typically show no data on temperature dependence except for the series resistance.
d) Fault Types—(a) fail open-circuit; (b) inter-turn short circuit; (c) winding to ground short circuit. An inductor or motor winding failure can be initiated by a voltage surge which causes the electrical insulation to break down. This can then lead to a shorted winding turn which then gets very hot (due to magnetically induced currents) and subsequently melts. Follow-on faults are more likely and practically modelled deterministically. Follow-on behavior could include:
  a. Shorted windings overheat and go open circuit. The inductor may become operational again, but with reduced inductance. Another fault can be inserted based on time or mean time between failures.
  b. Shorted windings overheat causing inductor to go open circuit. Future fault events have no effect.
  c. Shorted windings overheat and cause adjacent turn-turn short circuit—leaving two inductive short circuits.
  d. Shorted windings overheat and cause fault to ground.

Syntax—There are likely many resultant behaviors potentially following an inductor initial fault. Hence, the implementations provide a syntax that can be used to define resultant behavior(s) following the initial fault. Assuming that the resultant behavior can involve more than one topology, then a user may be able to define a sequence of topologies. For example, the following percentage winding splits might result from successive inter-turn short circuits:

100→10+90→10+10+80→10+10+10+70→10+10+ 10+10+60

Any part of the original winding can be in one of three states:
Functioning [N].
Inter-turn short circuit with corresponding mutual inductance loop [−N].
Inter-turn short circuit with blown corresponding mutual inductance loop k[inf].
Inter-turn short circuit with short to ground/case [0].
Open circuit krill.

Example 1

[−10 90] indicates first 10 windings form inter-turn short circuit with associated mutual inductance, leaving 90 effective windings.

Example 2

[0 90] indicates that the 10 isolated windings have now melted and caused a short to ground/case.

Example 3

[−10 −10 80] indicates that the heat from the initial 10 isolated windings caused the adjacent ones also to short creating a second inter-turn mutual inductance loop.

Example 4

[inf −10 80] indicates that the first 10 isolated windings have now gone open circuit.

Example 5

[inf] indicates the inductor went open circuit.

A user can specify a sequence of failure states with a matrix using NaN for blank entry:

[−10 90 NaN; −10 −10 80; 0 80 NaN]

If a simplifying assumption is made that it is possible to have one set of isolated windings at any given time, then the following syntax becomes possible:

[−percent1 −percent2 . . . −percent$N$ {inf|+percent-Short}]

The initial percentages represent successive numbers of adjacent windings lost. The final entry is either 'inf' or a positive number representing open-circuit and core short respectively. For a core short, the number of windings remaining may be determined from the sum of the preceding percentages. The location may be set by the value of the positive number, 0 for the left-hand end of the remaining windings, and 100 for the right-hand end of the remaining windings.

Following the initial fault event (which can be triggered using the same mechanisms as for the resistor, e.g., simulation time, statistical), subsequent failure state transitions may be stepped through. One possibility is a vector of transition times following the initial fault. Some simple physics-based conditions so that transitions depend on the inductor currents may include:

Option 1: Assume a thermal mass for the winding, plus a second thermal mass for the core. Thermal mass for any isolated set of windings is assumed to be a corresponding fraction of the total winding thermal mass. A user may provide conductance values for winding-winding and winding-core, and a melting temperature.

Option 2: Define a current level and associated time that produces melting.

An initial fault trigger may be implemented in a similar manner to the resistors, but also permits triggering from transient surge voltage. A transient surge voltage leads to breakdown of insulation, usually at the ends of the winding. Insulation lifetime halves for every 10° F. rise in temperature.

Figure 10:
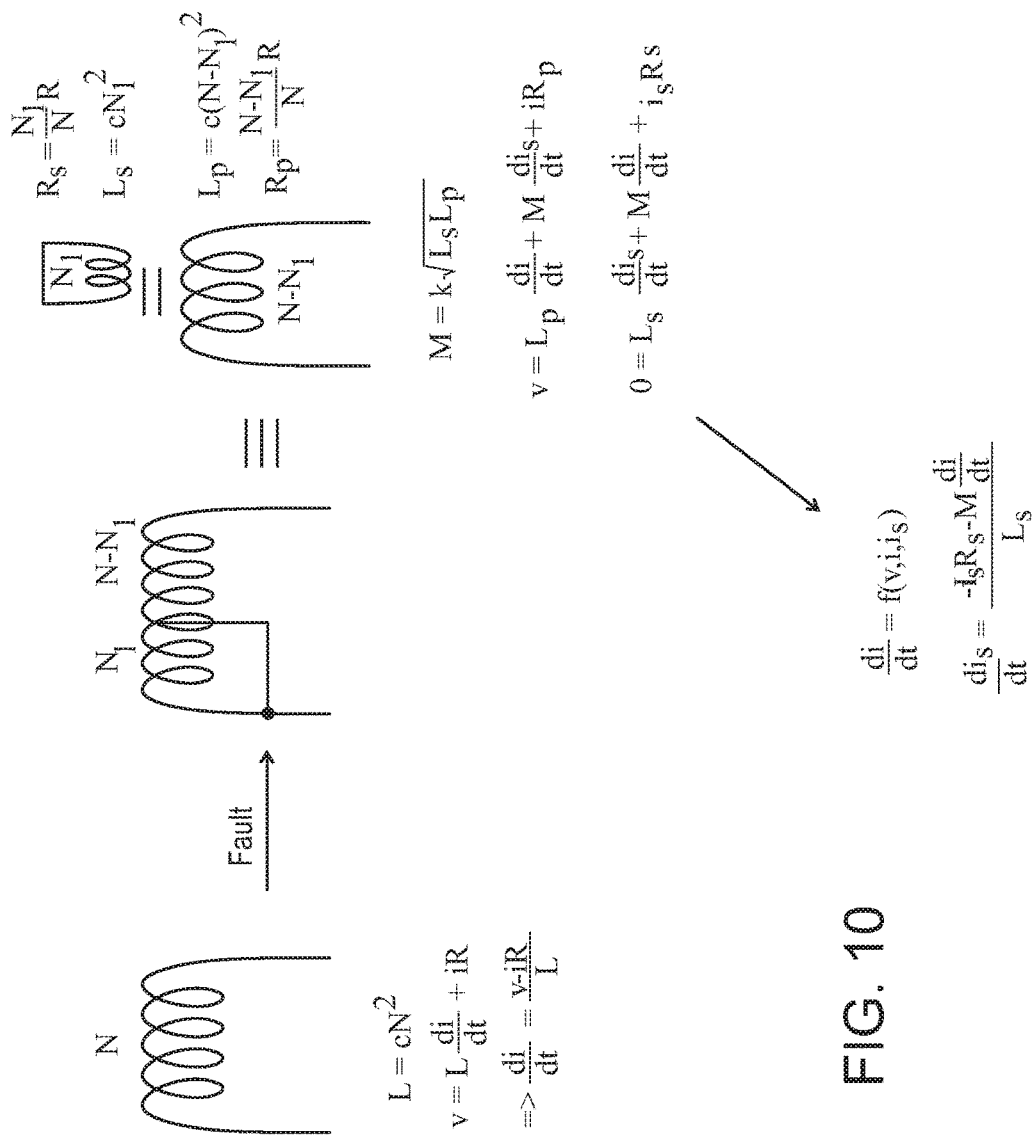
FIG. 10 is an example representation of a faulted inductor, and associated electrical signal equations.

Mathematical formulas supporting the inductor model are illustrated in FIG. 10. In this example, a restriction was added that only one short circuit mutual inductance secondary exists at any given time. Thus, there may be (for this case) only two differential equations. This also permits a simpler way to define the fault sequence (see above).

Figure 8A:
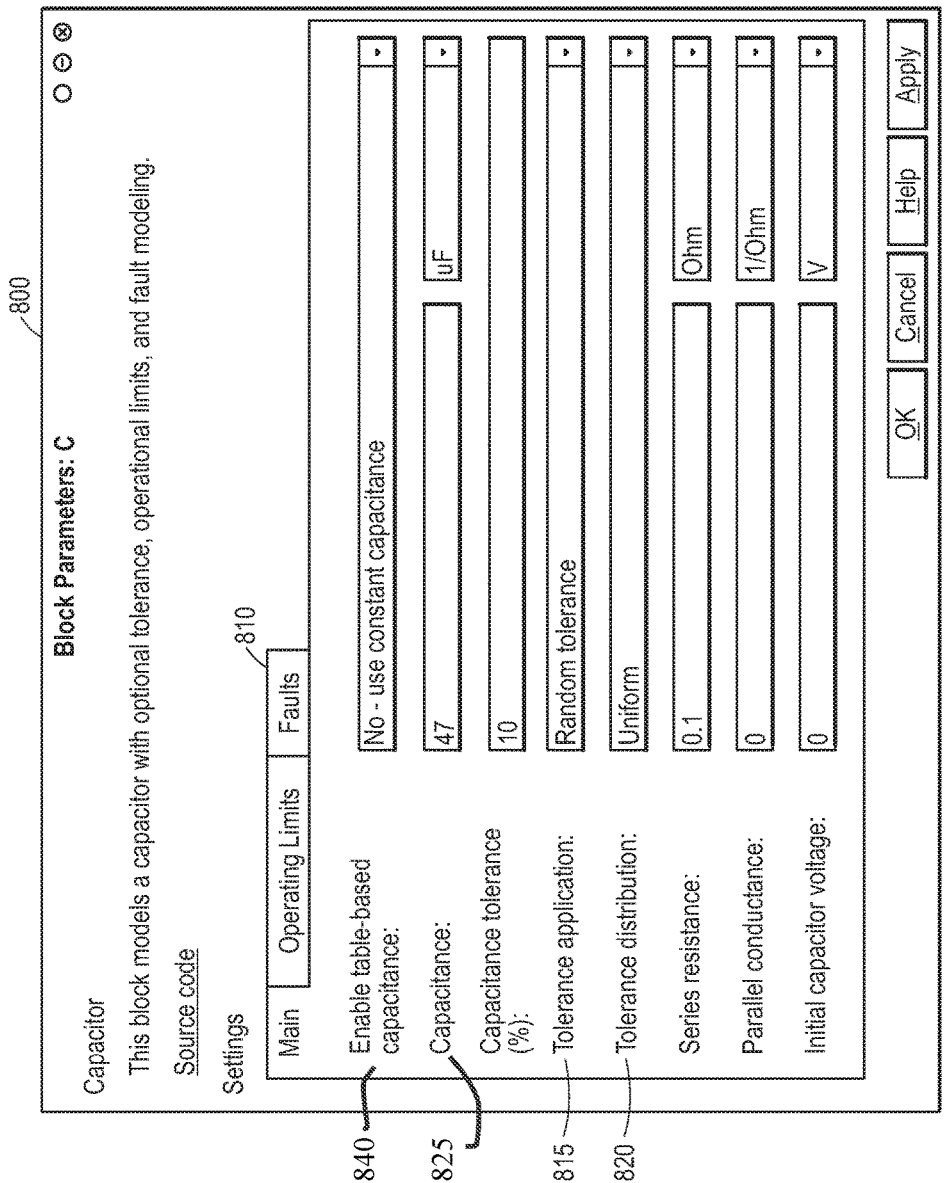

FIG. 8A illustrates example TCE dialog box for Main tab 840 for viewing and/or editing capacitor reliability parameters, including a nominal capacitance value 825, tolerance range 830, tolerance application 815 and tolerance distribution 820. FIGS. 8B and 8C illustrate, respectively, example TCE dialog boxes for Operating Limits tab 845 and Faults tab 810. An example capacitor model component might include the following parameters:

a) Tolerance: capacitance typical is approximately 10%; dependent on temperature
b) Operational Limits: voltage rating, reverse voltage, temperature for voltage rating, operating temperature range (e.g., −55, 125° C.), voltage derating above 85° C., max ripple current, frequency for max ripple current, derating factor for ripple current at higher temperatures, maximum power dissipation, dissipation factor
c) Faults: Modes of failure may include, among others: (1) dielectric breakdown due to overvoltage resulting in conductive pathway; (2) dielectric breakdown due to aging or electrode materials migrating across the dielectric; (3) mechanical breaking of the lead connection points e.g. due to vibration; (4) electrolyte drying out, reducing capacitance; (5) internal resistance increases, resulting in higher temperatures which ultimately reduce service life, usually failing with a short (e.g., a failure rate that doubles for every +10 degree temperature rise); (6) hazards defined by high operating voltages and ripple currents. Modeled fault conditions may include, among others: open-circuit; short (dielectric breakdown); value change; leakage current increases. FIG. 11 shows an exemplary failure mode distribution table for capacitors.

Other physical components that may be modeled include quartz crystals and ceramic resonators, whose reliability may depend on their frequency stability. Frequency oscillators including such components may susceptible to changes in frequency due to aging or environmental changes (e.g., temperature, mechanical vibration, pressure, humidity, etc.). Modeling such physical behaviors at the right level of fidelity allows designers to properly select oscillator components, as well as recommended periodicity of automatic adjustments or manual calibration of clock circuitry. As an example, due to aging and other factors mentioned, it may be difficult to keep quartz crystal based oscillators within $10^{-10}$ of their nominal frequency without constant adjustments. Quality issues may be mitigated by establishing an appropriate manual (e.g. service time) or automated calibration mechanism (e.g. global clock synchronization schemes). The systems and methods described herein may help make the right economical (cost/benefit) choice at the component level, such as using appropriate ceramic resonators vs. quartz crystal against a set of available or recommended components.

VI. EXAMPLE METHODS

Figure 12:
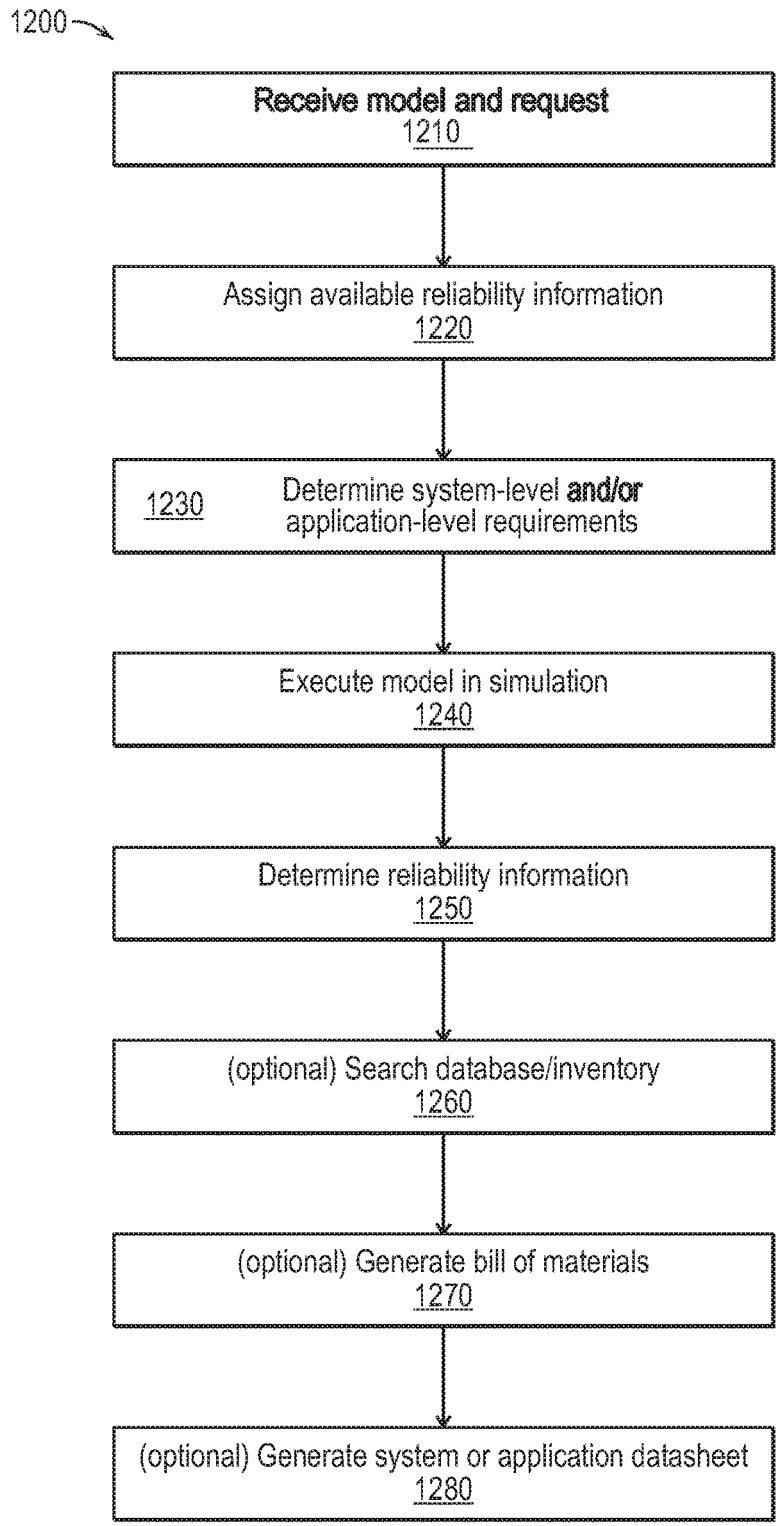
FIG. 12 is a flow diagram for a datasheet generation method implementation.

With reference to FIG. 12, exemplary implementations provide a process 1200 for using a TCE and relevant reliability information (e.g., performance rating, tolerance, operating limits, fault dynamics, etc.) in a simulation model to assess the system-level behavior of the dynamic physical system being modeled. In block 1210, a TCE may be employed to receive a model of the dynamic physical system, for example, in a block diagram and topology representative of the dynamic physical system, and one or more request(s). The model may have been created using the TCE, or received from another source. In a first embodiment a request may be received to generate one or more reliability information values defining acceptable operational behavior for a model component of the received model, where the reliability information values have not yet been defined. In another embodiment, the request received may be for the generation of a system-level or application-level datasheet. In block 1220, reliability information about the physical components of the physical system may be extracted from component supplier datasheets and assigned to associated model components in the system model through the TCE. A persistent link may be established between the model components and associated physical component datasheets, for traceability purposes. In block 1230, a set of system-level and/or application-level requirements may be established and may also be expressed using assertion conditions or blocks that automatically check compliance. In block 1240, the TCE may execute iteratively on the model, or components therein, measuring operating and fault conditions as described previously. For example, the TCE may use search or optimization based methods to find maximum tolerances and nominal reliability information values for the model components that can be used whilst still meeting the system-level or application-level requirements.

In some implementations, one or more of the component models may have at least one reliability information value that has not yet been specified. The simulation loops may vary the values of the known reliability information for model components across their known reliability information value ranges, while varying the values for the unknown reliability information across all (or an expected range of) values appropriate for the model component type and monitoring system or application behavior for combinations of reliability information values (known and to-be-determined) that violate the defined system or application requirements. In block 1250, the TCE outputs desired information. In some implementations, the desired output comprises nominal and/or range(s) of optimal reliability information values for the model component whose reliability information value(s) were previously unknown. One form of output this information may take is a component datasheet, which may be linked back to its associated model component.

In some implementations, block 1260 may involve the TCE searching a database (e.g., an inventory of available components) for components of the type used in the physical system having reliability information matching the values determined in block 1240. The TCE may generate a bill of materials in block 1270, including the model components and their respective reliability information, used to construct the dynamic physical system (including physical components available in inventory, or not). In some embodiments, in block 1280 the TCE generates a system-level datasheet, which may include a listing of the physical components of the dynamic physical system, the previously known or determined through simulation reliability information values associated with each of the physical components, and a representation of the topology (e.g, circuit, network, etc.) of the model components corresponding to the physical components.

Although FIG. 12 shows example blocks of process 1200, in some implementations, process 1200 may include additional blocks, fewer blocks, different blocks, or differently arranged blocks than those depicted in FIG. 12. Additionally, or alternatively, two or more of the blocks of process 1200 may be performed in parallel.

Figure 13:
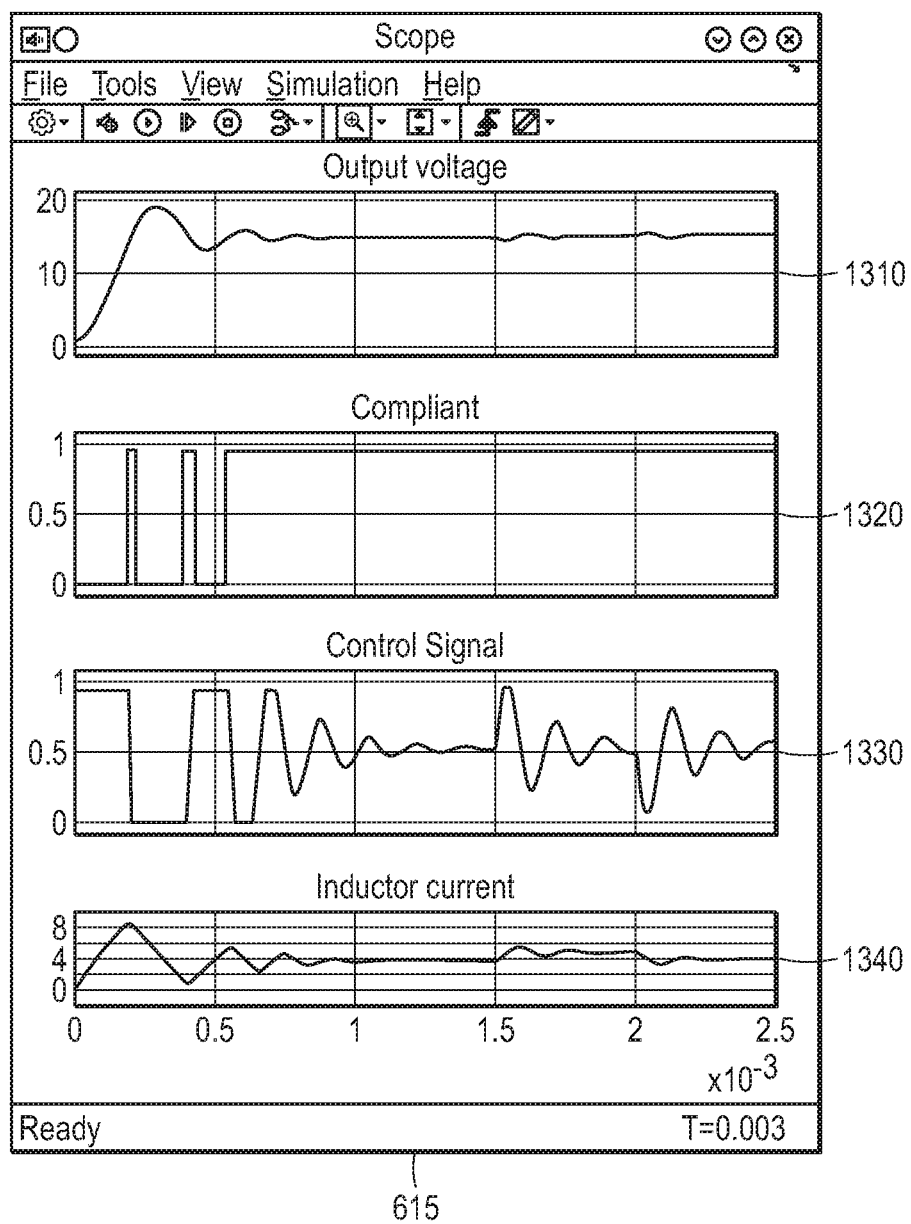
FIG. 13 is a screenshot of signals monitored during an example simulation.

With reference again to FIG. 6, a system datasheet generated for the power supply model 600 might, for example, include the following information: a regulated voltage set point and tracking error, a supported supply voltage range, and the heat generated by the modeled system. FIG. 13 illustrates an example screenshot of scope block 615 monitoring relevant reliability parameters for model 600. Suppose that the regulated output voltage 605 is required to be 15V±1V. Scope block 615 may capture monitored output voltage 605 and display it as signal 1310. The TCE may additionally be used to create an assertion block 611 having an output of "1" (as shown as signal 1320 in scope block 615) if the output voltage is compliant, e.g., it stays within the specified range of 15V±1V, and "0" otherwise.

Given model 600 including the fault assertion, model components with reliability information (e.g., the tolerances, performance ratings, operational limits and fault behaviors, etc.) defined, the TCE may be used to generate a datasheet for the physical power supply. An acceptable range for supply voltage 630 can be determined using an iterative simulation that incrementally increases the supply voltage 630, executes the model 600, and checks to see if output voltage 605 is in the range 14-16V by checking the status of the "Compliant" assertion block signal 1320. Similarly, if any of the model components goes outside of its defined operational limits, then a simulation assertion is generated, and operating with that particular supply voltage 630 on that iterative loop is ruled out.

Heat generated by the system may be determined for each simulation loop using logged simulation parameters. A command may be entered in a command line of the TCE to extract lost power from information logged during the simulation loop for each heat-generating component, for example:

| >>elec_getPowerLossSummary(simlog, 1, 5e−3, 3e−3) answer = | |
|---|---|
| LoggingNode | Power |
| MOSFET/1 (component 691) | 3.5084 |
| MOSFET/2 (component 692) | 2.8193 |
| resistor (component 645) | 0.021649 |
| D1 (component 693) | 2.3347e−06 |
| D2 (component 694) | 2.5752e−07 |

The above analyses can be repeated as part of a Monte Carlo test; the R, L and C components may have the random tolerances option enabled and the simulations run multiple times to achieve a desired level of confidence. Alternatively, if there only a few components, the extreme tolerance values may be applied to cover extreme value combinations.

Based on this model, a datasheet could be produced including the following reliability information:

Input voltage range: 20 to 50V
Output voltage: 15V±1V
Power-up time: 1 msec
Dissipated power: 7 W when driving a 5 A load As described, the implementations permit reliability datasheet generation for a subsystem or system. This datasheet may include a summary of possible failure cases presented as a fault tree. The implementations may generate probabilities of component and system failure using the system model and simulation. Initially, component faults may be identified by searching the system model. Then, for each component fault event, the probability information may be extracted from the component. If that fault event is catastrophic, the analysis may cease. Otherwise, the fault may be applied during simulation to find the next steady-state. The implementations may then recursively assert remaining component faults until ends of the fault tree's branches are reached. The system model may be utilized in this fashion to identify correlations, e.g., if one of two parallel actuators fails, the model may capture that the other actuator must work harder and now has increased probability of failing. Note that such analyses may be performed with fault detection and algorithms running.

Figure 14:
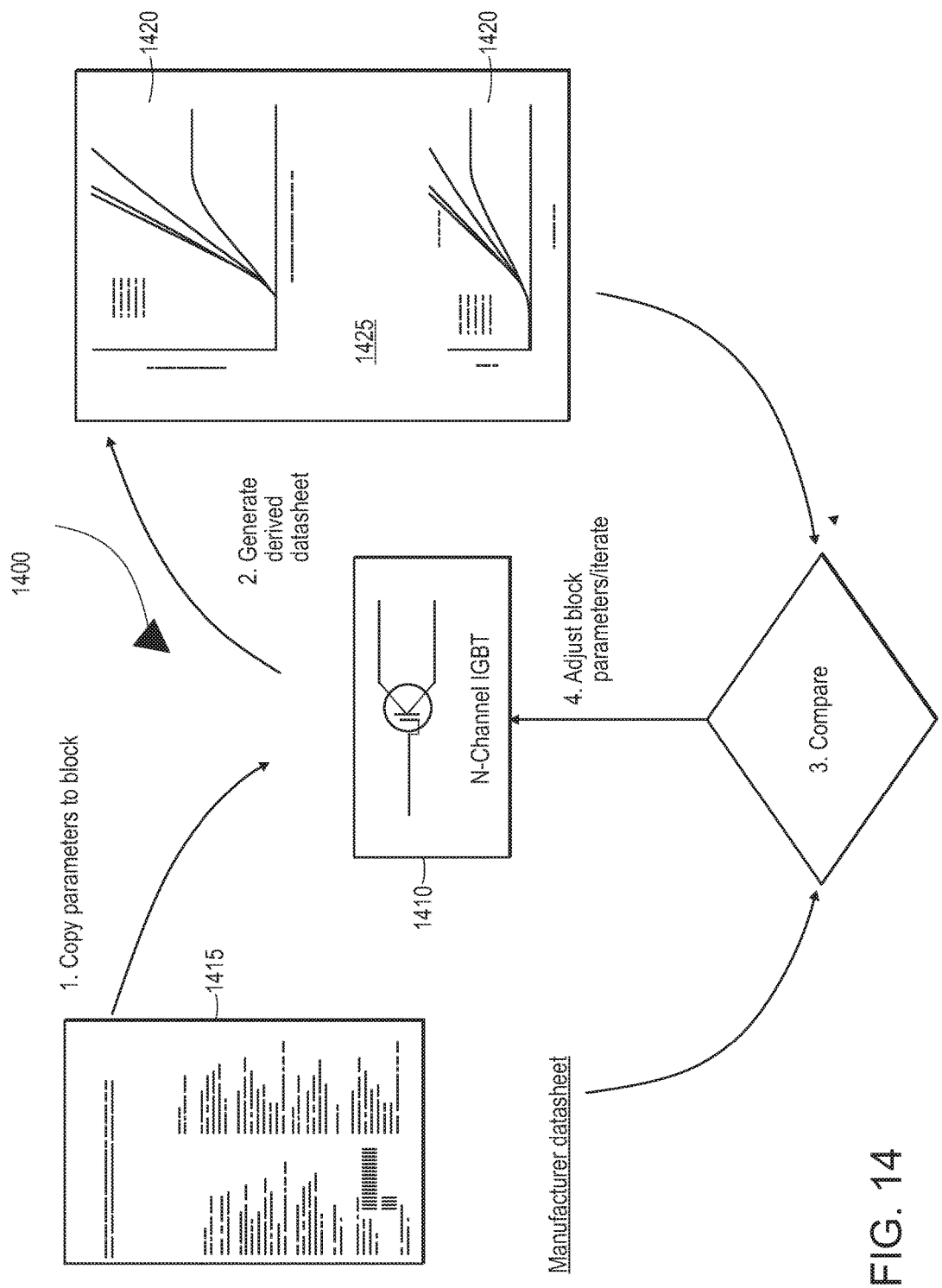
FIG. 14 is a workflow diagram representing an example datasheet generation implementation.

Consider the IGBT 1410 and workflow 1400 shown in FIG. 14. Some implementations may validate a block parameterization against an original datasheet 1415 automatically, with possible user tailoring of the generated plots 1420 of the derived datasheet 1425. Plots 1420 in generated datasheet 1425 may include, for example:

a) I-V characteristics for set of V_GE values.
b) I-V characteristics for nominal V_GE for set of different temperature values.
c) Time response showing V_GE, I_C and V_CE for turn-on and turn-off events.
d) Turn-on and turn-off losses as a function of current for set of different temperature values.

Even if plots are standardized, the user may define the axes ranges and arrays of gate-emitter voltages (V_GE) and temperatures. These may be saved so that the user may reuse or retrieve them tore-generate the datasheet. These range values may be stored on the block itself, for example, as hidden or as public parameters, etc. If hidden, then the datasheet value viewer may permit a user to set these hidden values.

Figure 15:
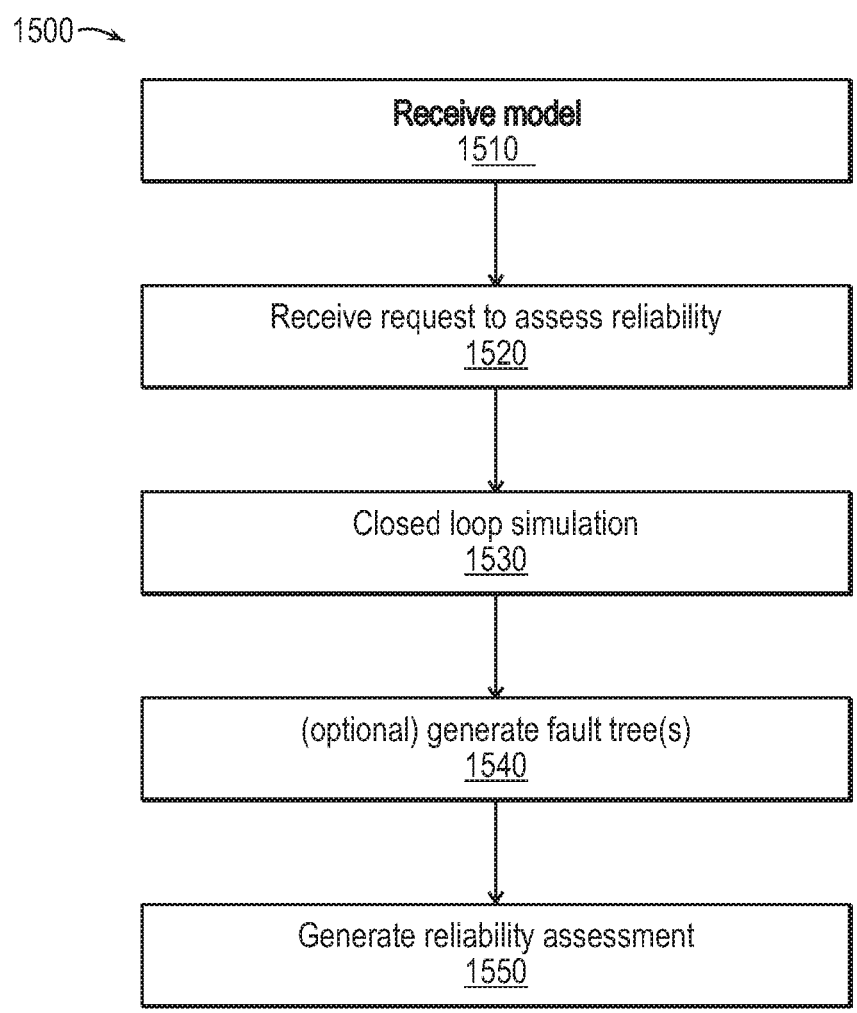
FIG. 15 is a flow diagram for a reliability assessment method implementation.

In some implementations, emergent failures can be predicted by monitoring the impact of one component's degraded behavior on another, or the impact of an invoked system-level stress (e.g., a temperature rise affecting model components) on particular components. An example process 1500 is illustrated in FIG. 15. In block 1510, a TCE may be used to receive a model for the physical system including reliability information for its model components, where the model could also have been created using the TCE. As previously noted, reliability information may comprise performance ratings, tolerances, operating limits, recoverable and/or non-recoverable fault dynamics, probabilistic and/or stochastic failure modes, cascading component failure information, and/or emergent system properties information, etc. In block 1520, a request may be received to assess reliability at the system level. In block 1530, the model is executed, perhaps iteratively in distinct simulation paths, in a closed loop simulation while varying one or more of the model components outside its associated reliability parameters. Individual component faults may be invoked, or external stimuli (e.g., extreme environmental conditions, user misuse, etc., that may be intended to cause performance degradation in at least one of the model components) may be applied. Component faults may be invoked by setting the reliability parameters and enabling faults (as shown in FIGS. 7A-7C, 8A-8C and 9A-9C and described in associated passages), and by operating the one or more model components outside a set performance rating or tolerance associated therewith. In block 1540, for each invoked fault and/or external stimuli that results in a failed behavior in the system or another component, the TCE generates a fault tree including the operating conditions that resulted in the failed system or other component degraded behavior. The effect on the performance of one or components in which faults have not been directly invoked may be measured. In block 1550, the TCE generates an assessment of system level reliability and/or the impact of the invoked fault conditions on one or more model components within the system.

Although FIG. 15 shows example blocks of process 1500, in some implementations, process 1500 may include additional blocks, fewer blocks, different blocks, or differently arranged blocks than those depicted in FIG. 15. Additionally, or alternatively, two or more of the blocks of process 1500 may be performed in parallel.

Figure 16:
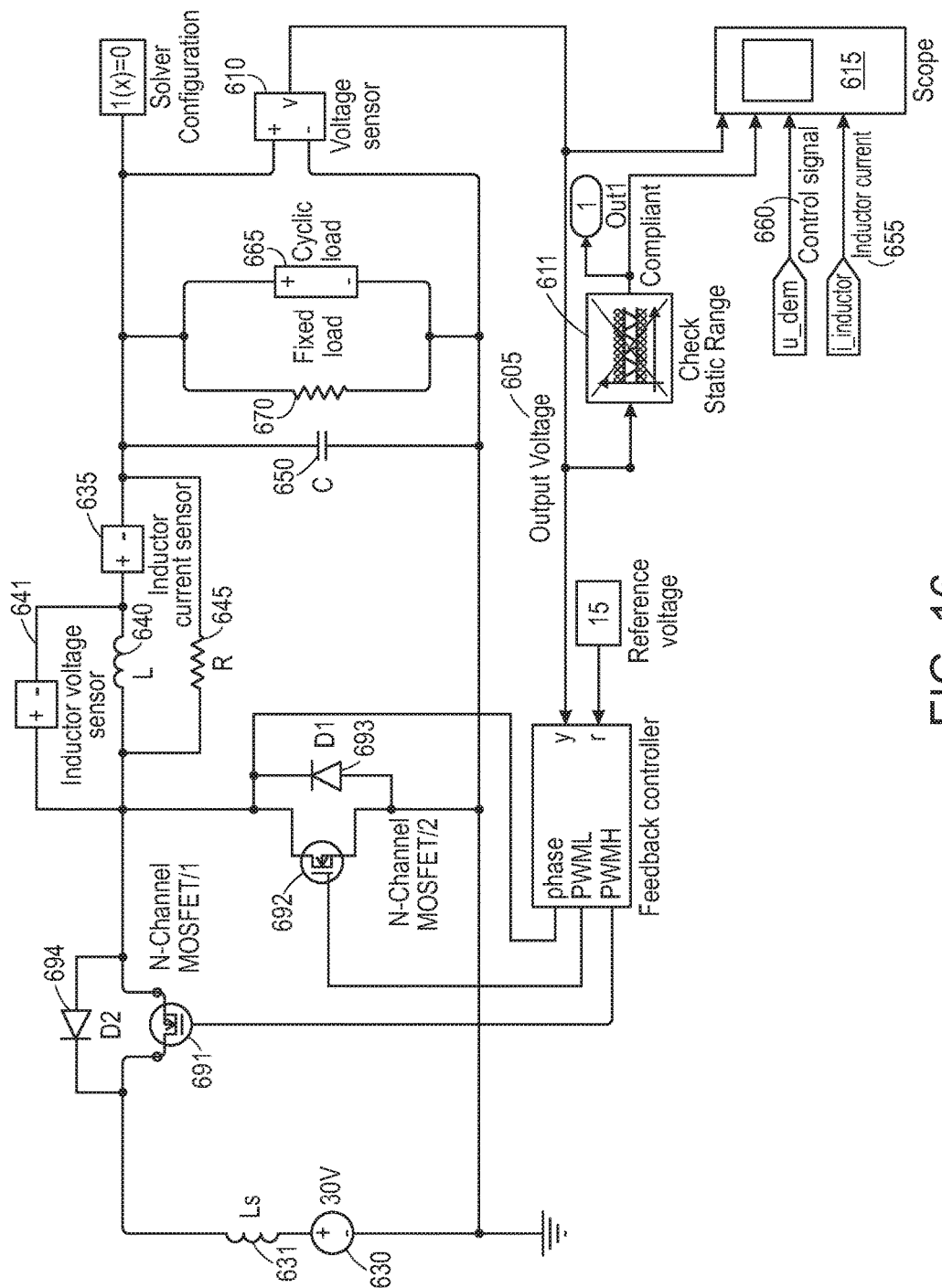
FIG. 16 is an illustration of a modeled regulated power supply circuit with a faulted power input power supply.
Figure 17:
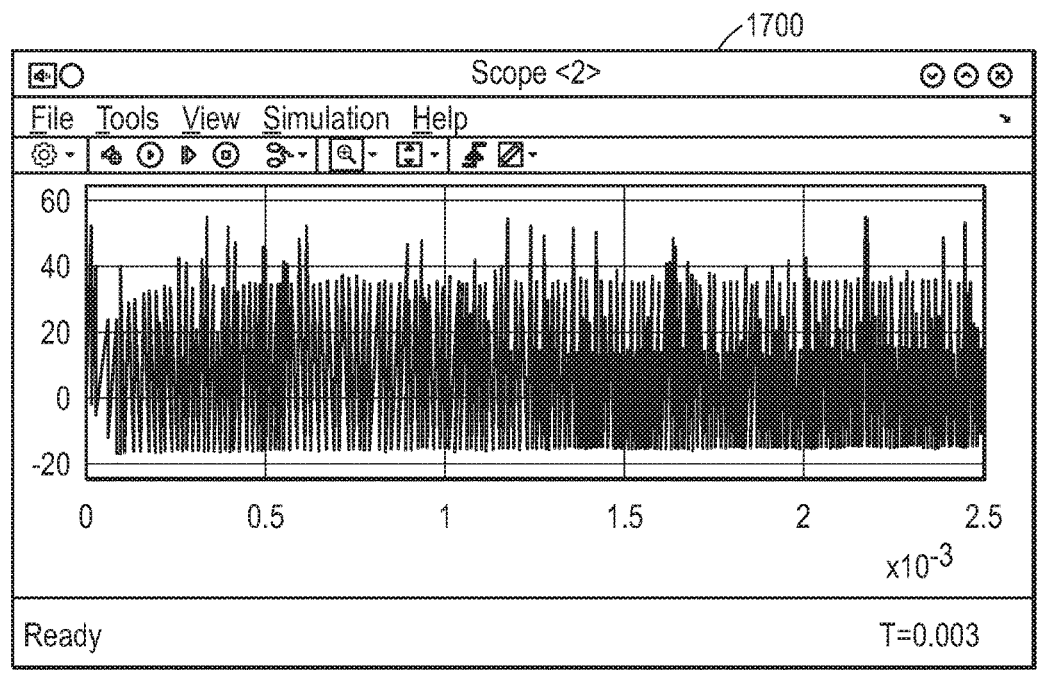
FIG. 17 is a screenshot of a signal monitored during an example simulation.

With reference again to the regulated power supply model example, as illustrated in FIG. 16, the implementations described herein permit capture of failure modes, so they can be used to mitigate difficulties of predicting MTBF or other reliability levels. For example, if the power supply 630 exhibits voltage spikes or causes voltage spikes on the regulator input, the insulation of the regulator's inductor (represented as inductor block 640) may break down, further causing a short circuit of the inductor's windings. The inductor block 640 (or its fault block 641 if the system model is so configured) may already be parameterized to fail if, for example, the voltage across it spikes above 40V on more than 5 occasions. Alternatively, this fault may be triggered at a specific simulation time by setting the Enable fault parameter 905 (shown in FIG. 9C) to "Yes". The method described above may be used, and the 30V power supply 630 modeled as having an internal inductance (Ls) represented as inductor block 631, across which the voltage periodically spikes above 40V, as shown in the screenshot 1700 of a scope block 615 illustrated in FIG. 17.

Figure 18:
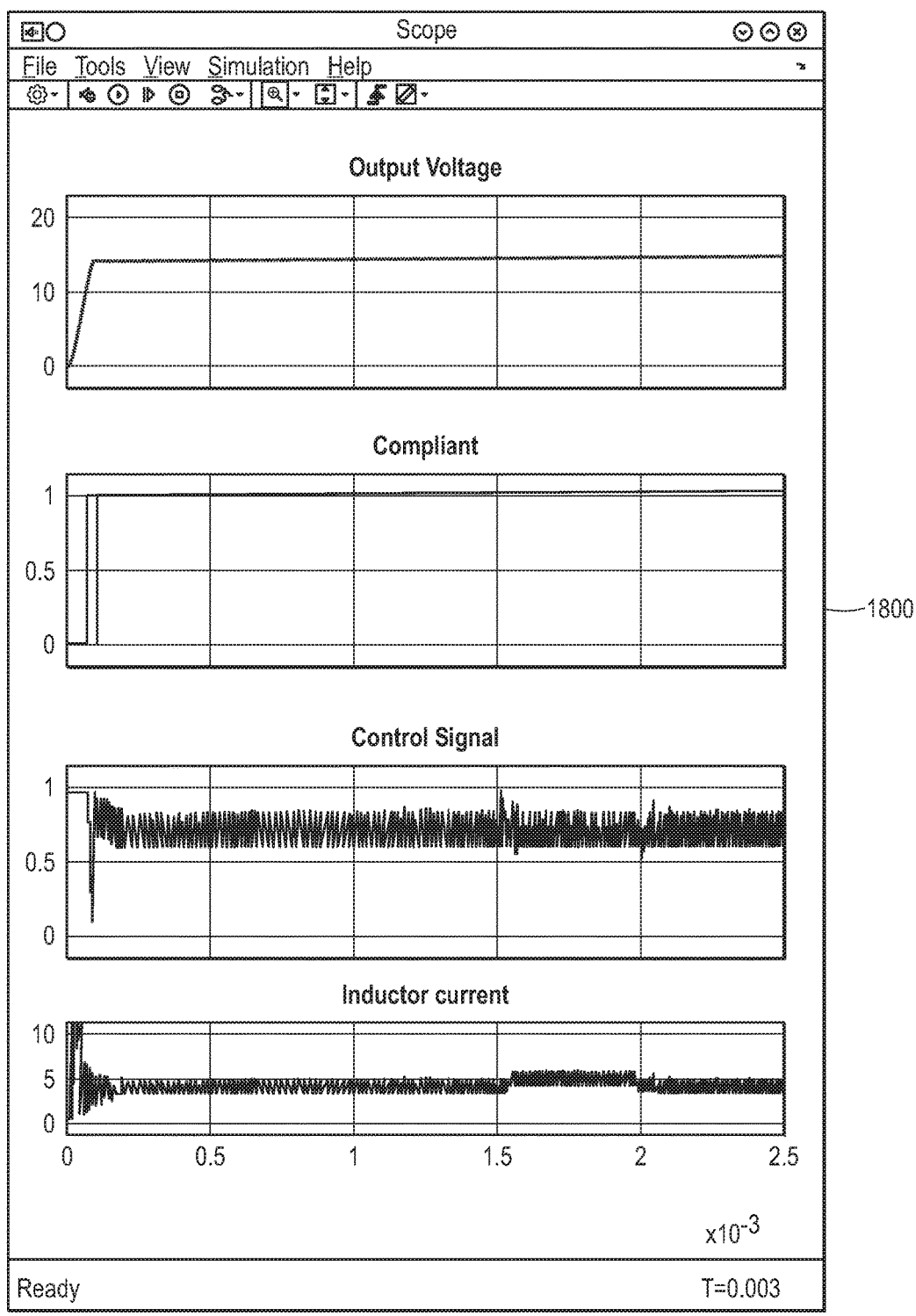
FIG. 18 is a screenshot of signals monitored during an example simulation.

If inductor 640 fails, for example, shorting out the first 25% of the windings, the overall system still operates correctly (compliant signal 1800 of FIG. 18 still indicates "1" following initialization of the failure). However, it does have an impact on the MOSFETs 691,692, which now dissipate more power, as can be seen in the output of the power analysis function. Executing the extraction command again at the command line of the TCE again extracts information logged during the simulation loop for each heat-generating component:

| >>elec_getPowerLossSummary(simlog, 1, 5e−3, 2e−3) answer = | |
|---|---|
| LoggingNode | Power |
| MOSFET/1 (component 691) | 13.666 |
| MOSFET/2 (component 692) | 0.96824 |
| resistor (component 645) | 0.019079 |
| D1 (component 693) | 0.082716 |
| D2 (component 694) | 0.0070653 |

Power dissipated in MOSFET_1 has increased from 3.5 watts to 13.7 watts. This will then impact the MTBFs for the MOSFET, making a subsequent and catastrophic fault of the MOSFET more likely. It may also result in a direct deterministic failure when the temperature exceeds a maximum value.

In the context of fault tree analysis, failures of the inductor block 640 may be included in categories such as:
1) Those that cause immediate system failure e.g. the inductor goes open circuit.
2) Those that don't cause a direct system failure, but that cause other components to become more likely to fail (reduced time between failures).
3) Those that don't cause a direct system failure, but go on to cause other components to fail deterministically e.g. due to increased temperature.

Using faultable component models makes exploration of such failure modes much easier. In some implementations, the model may be used to construct the fault tree automatically. In some implementations, a fault tree generation process (such as represented by block 1540 of FIG. 15) may include:
a) Finding a list (F) of modeled faults by searching the model; each model component may have more than one fault type, e.g., the inductor may fail open circuit, reduced windings, reduced windings with secondary, etc.

b) Invoking each listed element $F_i$ in turn, and monitoring for system failures (failure meaning either immediately failing or leading to a deterministic knock-on failure):
  i) If the system fails, save this failure condition; move to the next element of F.
  ii) If the system does not fail, keep the fault applied and recursively repeat 2 applying faults $F_j$, j~=i.

The result may be a list of component failures or failure combinations that lead to the system failing, and this information could be expressed as a fault tree. The fault tree may then be combined with information about MTBFs or failure rate distributions for each of the model components to determine a reliability level for the overall system, and/or generate a system-level datasheet.

In some implementations, failure probabilities may be generated using the TCE to execute the model in simulation. For example, such a process may begin by identifying model component faults by searching the model. Probability information may then be extracted for each fault event from the relevant model component. If a fault event is catastrophic for the system, processing stops. Otherwise, the fault is applied and simulation continues to find the next steady-state of the dynamic behavior of the system. Recursive loops continue using the remaining component faults until the ends of the fault tree branches are reached. The resulting set of system failure conditions makes up the system-level fault tree. Such processes reveal information about cascading failures inherent in a system, and/or failure modes not immediately evident (e.g., appearing over time). External factors or conditions may also be applied, such as environmental conditions, human misuse (e.g., pilot error in a flight physics simulator), electric and magnetic fields, etc. Thus, the model may be used to identify correlations, e.g., if one of two parallel actuators fails, simulation using the model will identify that the other actuator must work harder and now has increased probability of failure.

VII. SYSTEM MODELING EXAMPLES

The methods and systems implementations described herein, as noted, may be applied to a large number of multi-domain applications. Just a few of the application areas may include electromechanical and "cyber system" products, automotive/ground transportation components and vehicles, aerospace components and vehicles, and power distribution grid reliability/availability.

Application Example 1

Power Distribution Grid Modeling

Needs from model:
  Investigate whether loads can be met/planning.
  Validate scheduling algorithm(s).
  Show system stability.
To deliver, the system model requires:
  Nominal models (e.g., generators, loads, and distribution)
  Failure modes (e.g., fault locations, dynamics)
  Fault probabilities (e.g., generators, loads, and network)
  Control algorithms

Application Example 2

Hand Dryer

Reliability requirements:
RL1: Unit catches fire with probability $1e^{-9}$ per hour.
RL2: Unit fails to deliver rated airflow with probability $1e^{-4}$ per hour.
RL3: Unit fails completely (no airflow) with probability $1e^{-5}$ per hour.
For RL1, consider the case where the unit is still operated following another failure, e.g., a single winding has failed, so another two windings and power electronics work harder to deliver the same RPM/airflow
Analysis should take into account tolerances for all model components, e.g., for resistance values.

| Fault | Fault type | Depends on/knock-on effect |
|---|---|---|
| External mains under-voltage | Statistical with distribution of start frequency, duration and value. | |
| External mains voltage surge | Statistical with distribution of start frequency, duration and value | |
| AC fuse | Deterministic | Current/time combination. Possible de-rating based on previous near-failure events history. |
| Resistor open-circuit | Deterministic and statistical. | Deterministic failure depends on current/time/temperature. Probability of failure may need increasing if operated close to rated power. |
| Motor bearing failure | Statistical | Back EMF drops, so currents go up - IGBTs have greater loading. |
| 1 of 3 windings goes open circuit due to mechanical fault | Statistical | Unbalanced torque, which stresses the bearing. Also forces remaining two windings to work harder. Motor may start in condition where there is no torque, or where torque is insufficient to start rotation. |
| Part of one winding is short-circuited | Deterministic (voltage spike creates conditions for insulation breakdown) and statistical (insulation breaks down). | Isolated winding(s) heat up due to ratio and high induced current –> melts copper –> takes out adjacent windings and/or creates fault to ground. |
| Fault to ground | Statistical | |

Application Example 3

Heterogeneous Domain System Model Example

Figure 19:
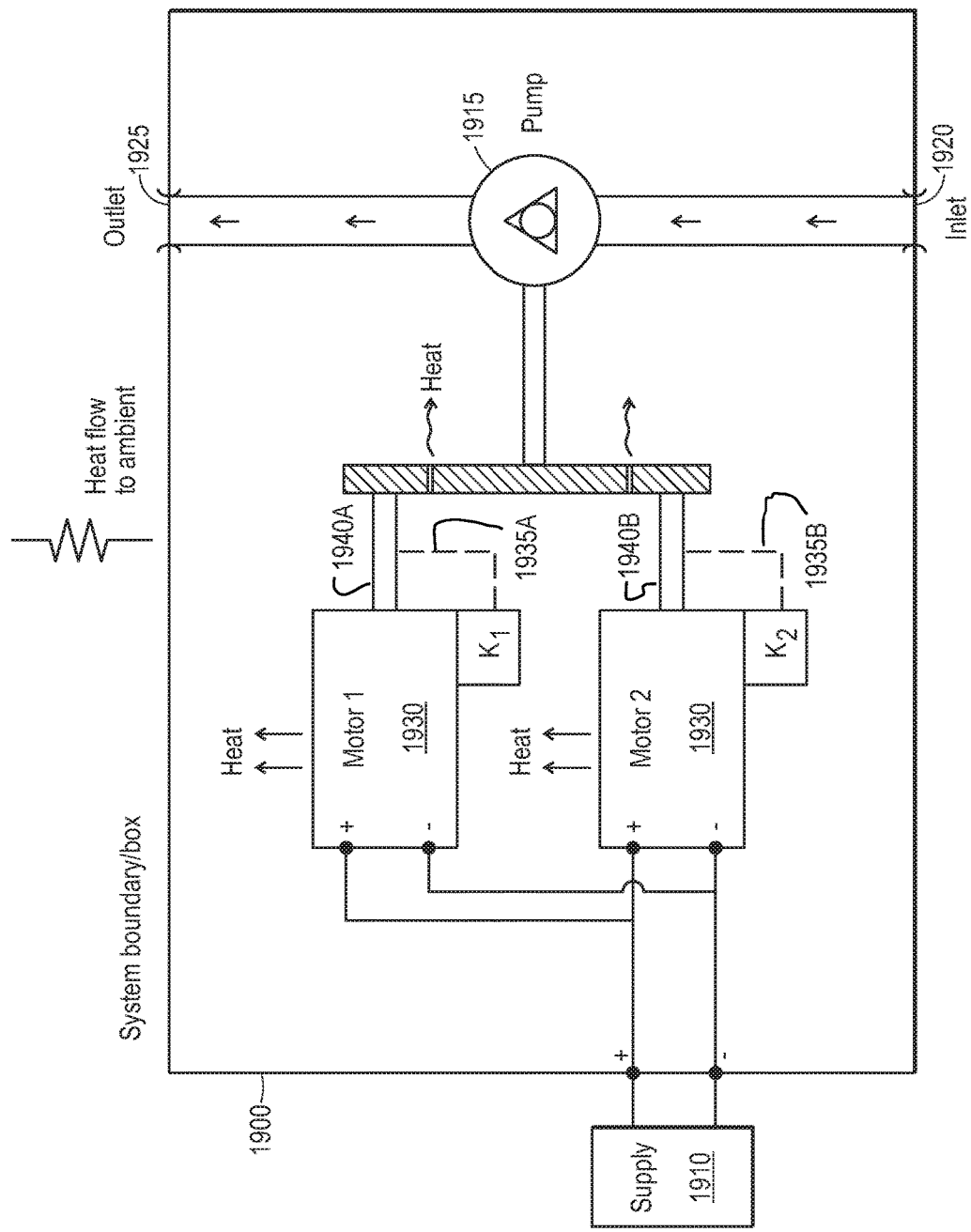
FIG. 19 is a diagram of a modeled system including heterogeneous model.

A more comprehensive, heterogeneous domain model 1900, representing a safety-critical pump (e.g., for use in a medical purpose), is depicted in FIG. 19. A supplier might be responsible for providing a unit that works from an external DC supply 1910, and provides a pump 1915 specified flow rate (nominal value plus permitted range) from an inlet tube 1920 to an outlet tube 1925. The pump 1915 may typically operate over a set of operating conditions (DC supply voltage range, ambient temperature, pressure difference seen across the fluid connections), and achieve some specified reliability level (e.g., MTBF).

The supplier may desire to design an architecture with redundant motors 1930, e.g., two motors in case one fails. K1 and K2 represent feedback controllers for the motors 1930. The feedback controllers K1, K2 may comprise an inner-loop current controller and an outer-loop speed controller. Lines 1935A, 1935B from respective motor shafts 1940A, 1940B represent shaft speed measurements. Feedback controllers K1, K2 ensure, for example, that if one of the redundant motors 1930 fails, the other motor will work harder to maintain the pump flow rate. The supplier may also want to assess other architectures that have two motors and two series-connected pumps, for comparison purposes.

It is assumed that the supplier has information for each of the main components (motor, controller, gearbox and pump, etc.) in the form of datasheets from its suppliers, e.g.:

Motor Datasheet Information
1. Rated supply voltage 3 volts.
2. Torque constant 10-4 Nm/A, tolerance ±5%.
3. Nominal resistance 5 ohms at 25° Celsius, tolerance ±5%.
4. Resistance temperature coefficient 0.004/K.
5. Power rating 2 watts up to 70° Celsius, zero at 150° Celsius.
6. Maximum winding current 2 A and time to fail open-circuit at this current 10 seconds.
7. Winding thermal mass 200 J/K.
8. Mean time between failures (MTBF) for winding mechanical failure $10^5$ hours.

Gearbox Datasheet Information
1. Sun-planet gear ratio 5.
2. Maximum sun-planet torque 0.1 Nm.
3. MTBF for mechanical failure $10^5$ hours.

Pump Datasheet Information
1. Displacement 10 $cm^3$/rev.
2. Nominal speed 200 rpm.
3. MTBF for mechanical failure 105 hours.

With respect to capturing information for the model 1900, motor reliability parameters 3, 4, 5, 6 & 7 may be provided (e.g., from a library) by a resistor block, as described above. Motor data parameters 1 and 2 may use extensions to a DC Motor library block, in a manner similar to that of the resistor block. Motor data parameter 8 (MTBF) may also be captured in the resistor block. Similar library block extensions to those described for the resistor block may be applied for component models for gear library blocks and hydraulic Pump blocks to capture operating limits (e.g. maximum sun-planet torque) and MTBF information.

A callback function for linking the model components to associated datasheets (for traceability purposes) may be present on the model component GUI or dialog box(es) associated with each model component. The function may operate to open the original component datasheet.

With respect to certain implementations' treatment of deterministic failure and dependencies, consideration may be given to dependencies that might lead to failure, including: (a) whether the combination of two motors (torque constant and associated tolerance), pump torque (worst case pressure difference and friction) cause the gearbox to exceed maximum torque; (b) whether the heat generated by all components result in either of the motors exceeding their operational limit; and (c) whether transient conditions or steady states may be found that result in winding current exceeding the 2 A limit for 10 seconds. Because all relevant component data has been captured and associated implementation equations determined, these questions can be answered by simulating the system model with different extreme external conditions (power supply voltage, power supply fluctuation, pump pressure drop, ambient temperature). Automated scripting may be used to set up the simulations.

With respect to the implementations' treatment of statistical failure and dependencies, a script may search the system model for any components that have MTBF information. In this example, there are two motors, a gearbox, and the pump having such information. Each failure may be invoked (e.g. at a particular time set in the resistor component block) and the system model executed to determine whether the pump is able to deliver the specified flow rate. If the system fails, this becomes an end node of the fault tree. If it does not fail, then the component failure may be maintained and other components may be sequentially failed, re-simulating each time. In this manner, a fault tree may be built from the system model. If one motor of a redundant design fails, the system may still be un-faulted as it can still deliver the required flow rate. However, the remaining motor has to work harder and may fail deterministically. If the design is correct, then the second motor does not fail, but because the second motor is working harder, the MTBF reduces. If the motor supplier has information on MTBF as a function of load, then this may be used to provide a more accurate probability of failure for the fault tree.

Because a network approach has been utilized, wherein the product of through and across variables is power, a script may be used to determine total electrical power. This may then be used to provide information on worst case power requirements for use in datasheet generation for the safety-critical pump system.

The foregoing actions result in output for the example system that may be captured in a datasheet for the overall safety-critical pump system. This may be produced using a report-generating function. A first section of the report may list components along with hyperlinks back to the original supplier datasheets for traceability. Subsequent sections then report on deterministic faults, fault tree, derived operating limits, and other requirements, e.g. electrical power.

VIII. CONCLUSION

The foregoing description of implementations provides illustration and description, but is not intended to be exhaustive or to limit the implementations to the precise form disclosed. Modifications and variations are possible in light of the above teachings or may be acquired from practice of the implementations.

It will be apparent that example aspects, as described above, may be implemented in many different forms of software, firmware, and hardware in the implementations illustrated in the figures. The actual software code or specialized control hardware used to implement these aspects should not be construed as limiting. Thus, the operation and behavior of the aspects were described without reference to the specific software code—it being understood that software and control hardware could be designed to implement the aspects based on the description herein.

Even though particular combinations of features are recited in the claims and/or disclosed in the specification, these combinations are not intended to limit the disclosure of the implementations. In fact, many of these features may be combined in ways not specifically recited in the claims and/or disclosed in the specification. Although each dependent claim listed below may directly depend on only one other claim, the disclosure of the implementations includes each dependent claim in combination with every other claim in the claim set.

No element, act, or instruction used in the present application should be construed as critical or essential to the implementations unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

Example

The following example implements one or more aspects of the methods and/or systems of the present disclosure. This example is non-limiting. Features of different examples may be combined in other implementations and/or may be modified or removed in other implementations.

In one embodiment, the method, implemented by one or more processors, might comprise the following steps:
receiving a model in a technical computing environment (TCE), the model when executed, simulating behavior of a dynamic physical system, the model including a set of system-level requirements defining acceptable operational behavior for the dynamic physical system, and a topology of model components, the model components corresponding to physical components within the dynamic physical system and including at least one reliability information value defining acceptable operational behavior of the model components;
receiving a request to generate a system-level or application-level datasheet;
in response to the request, compiling, by the computing device, the system-level or application-level datasheet including one or more of:
a set of values defining overall system performance;
a set of figures defining overall system performance;
a set of values defining system operating region constraints;
expected overall system reliability information and possible failure modes;
a listing of the physical components of the dynamic physical system;
known or determined reliability information values associated with the physical components; and
a representation of the topology of the model components corresponding to the physical components.

What is claimed is:
1. A computer-readable medium storing instructions, the instructions comprising one or more instructions that, when executed by one or more processors, cause the one or more processors to:
receive a model in a technical computing environment (TCE), the model when executed, simulating behavior of a dynamic physical system, the model including a plurality of model components, the model components corresponding to physical elements associated with the dynamic physical system and associated with at least one performance rating or tolerance;
receive a request to model reliability of the dynamic physical system; and
in response to the request, execute the model in a simulation that includes simulation paths wherein one or more model components, of the model components, are operated outside at least one rating or tolerance asso- ciated with the one or more model components to determine a reliability level of the dynamic physical system, during execution of the model:
execute the model iteratively in the simulation paths, where each simulation path includes operating at least one model component, of the one or more model components, outside at least one rating or tolerance associated with the at least one model component; and
for each iteration that results in a failed behavior in a simulated dynamic physical system, automatically generate component reliability information that indicates operating conditions resulting in the failed behavior.

2. The computer-readable medium of claim 1, wherein the executed one or more instructions further cause the one or more processors to:
during the executing the model:
iteratively invoke one or more faults in at least one of the model components; and
for each invoked one or more faults that results in the failed behavior in the simulated dynamic physical system, generate a fault tree including operating conditions resulting in the failed behavior.

3. The computer-readable medium of claim 1, wherein the executed one or more instructions further cause the one or more processors to:
during executing the model:
apply one or more external stimuli to the simulated dynamic physical system intended to cause performance degradation in at least one of the model components; and
for each applied one or more stimuli that results in the failed behavior in the simulated dynamic physical system, generate a fault tree including operating conditions resulting in the failed behavior.

4. The computer-readable medium of claim 1, wherein the executed one or more instructions further cause the one or more processors to:
during the executing the model:
iteratively invoke one or more faults in at least one of the model components; and
measure an effect on performance that the one or more invoked faults generates in one or more other model components in which faults have not been invoked.

5. The computer-readable medium of claim 1, wherein the executed one or more instructions further cause the one or more processors to generate Hardware Description Language (HDL) code from the model.

6. The computer-readable medium of claim 5, wherein the executed one or more instructions further cause the one or more processors to:
synthesize a programmable hardware device with the generated HDL code; and
test the programmable hardware device.

7. The computer-readable medium of claim 6, wherein the executed one or more instructions further cause the one or more processors to test the programmable hardware device through Hardware-in-the-Loop (HIL) testing, and wherein the programmable hardware device is connected to a computing device including the one or more processors.

8. The computer-readable medium of claim 7, wherein the executed one or more instructions further cause the one or more processors to run another model that interfaces with the programmable hardware device.

9. The computer-readable medium of claim 1, wherein the executed one or more instructions further cause the one or more processors to:
generate code for representing one or more nonconformance with at least one physical component reliability parameter that controls a behavior of at least one of the one or more model components resulting from simulation testing using the model.

10. The computer-readable medium of claim 9, wherein the at least one physical component reliability parameter comprises at least one of an operating limit, a recoverable or non-recoverable fault dynamics condition, or a performance tolerance.

11. The computer-readable medium of claim 9, wherein the executed one or more instructions further cause the one or more processors to generate a dialog box permitting user editing of the at least one physical component reliability parameter.

12. The computer-readable medium of claim 11, wherein the at least one physical component reliability parameter is initialized to a predetermined value based on a selection from a library, via the dialog box, of a physical component to be modeled.

13. The computer-readable medium of claim 9, wherein the at least one physical component reliability parameter is extracted from a datasheet associated with a physical component to be modeled.

14. The computer-readable medium of claim 1, wherein the executed one or more instructions further cause the one or more processors to:
connect the model to a target device to enable a processor-in-the-loop (PIL) configuration or hardware-in-the-loop (HIL) configuration; and
wherein the executed one or more instructions, when executed to cause the one or more processors to execute the model, cause the one or more processors to:
execute the model in a PIL simulation or a HIL simulation that includes the simulation paths.

15. A computer-implemented method, comprising:
receiving, by a computing device, a technical computing environment (TCE) model that, when executed, simulates behavior of a dynamic physical system, the model including
a set of system-level requirements defining acceptable operational behavior for the dynamic physical system, and
a topology of model components, each of the model components corresponding to a physical component within the dynamic physical system and including at least one reliability information value defining acceptable operational behavior of the model component, wherein at least one model component has reliability information for which one or more values have not been defined;
receiving, by the computing device, a request to generate one or more values for the reliability information for the at least one model component; and
in response to the request, executing, by the computing device, the TCE model in iterative simulations such that
operational behaviors of the model components having known reliability information values are varied across a value range(s) defined in the respective reliability information,
an operational behavior of the at least one model component having undefined reliability information value is varied so as to determine a range of reliability information values that maintain operation of the TCE model within the acceptable operational behavior defined by the set of system-level requirements.

16. The computer-implemented method of claim 15, further comprising:
identifying, by the computing device, within a database of reliability specifications representing an inventory of available physical components, a set of reliability information values encompassed by the determined range of reliability information values for the at least one model component.

17. The computer-implemented method of claim 16, further comprising:
generating, by the computing device, a bill of materials for the dynamic physical system, including the available physical components associated with the identified set of reliability information values encompassed by the determined range of reliability values for the at least one model component.

18. A computer-implemented method, comprising:
receiving, by a computing device, a model in a technical computing environment (TCE), the model when executed, simulating behavior of a dynamic physical system, the model including a set of system-level requirements defining acceptable operational behavior for the dynamic physical system, and a topology of model components, the model components corresponding to physical components within the dynamic physical system and including at least one reliability information value defining acceptable operational behavior of the model components;
receiving, by the computing device, a request to generate a system-level or application-level datasheet;
in response to the request, compiling, by the computing device, the system-level or application-level datasheet based on component level information and the model, the system-level or application-level datasheet including one or more of:
a set of values defining overall system performance;
a set of figures defining overall system performance;
a set of values defining system operating region constraints;
expected overall system reliability information and possible failure modes;
a listing of the physical components of the dynamic physical system;
known or determined reliability information values associated with the physical components; or
a representation of the topology of the model components corresponding to the physical components.

19. A device comprising:
one or more processors to:
receive a model in a technical computing environment (TCE), the model when executed, simulating behavior of a dynamic physical system, the model including a plurality of model components, the model components corresponding to physical elements associated with the dynamic physical system and associated with at least one performance rating or tolerance;
receive a request to model reliability of the dynamic physical system; and
in response to the request, execute the model in a simulation that includes simulation paths wherein one or more model components, of the model components, are operated outside at least one rating or tolerance associated with the one or more model components to determine a reliability level of the dynamic physical system,
during execution of the model:
execute the model iteratively in the simulation paths, where each simulation path includes operating at least one model component, of the one or more model components, outside at least one rating or tolerance associated with the at least one model component; and
for each iteration that results in a failed behavior in a simulated dynamic physical system, automatically generate component reliability information that indicates operating conditions resulting in the failed behavior.

20. A computer-implemented method, comprising:
receiving, by a device, a model in a technical computing environment (TCE), the model when executed, simulating behavior of a dynamic physical system, the model including a plurality of model components, the model components corresponding to physical elements associated with the dynamic physical system and associated with at least one performance rating or tolerance;
receiving, by the device, a request to model reliability of the dynamic physical system; and
in response to the request, executing, by the device, the model in a simulation that includes simulation paths wherein one or more model components, of the model components, are operated outside at least one rating or tolerance associated with the one or more model components to determine a reliability level of the dynamic physical system,
where executing the model includes:
executing the model iteratively in the simulation paths, where each simulation path includes operating at least one model component, of the one or more model components, outside at least one rating or tolerance associated with the at least one model component; and
for each iteration that results in a failed behavior in a simulated dynamic physical system, automatically generating component reliability information that indicates operating conditions resulting in the failed behavior.

21. A device, comprising:
one or more processors to:
receive a technical computing environment (TCE) model that, when executed, simulates behavior of a dynamic physical system, the model including:
a set of system-level requirements defining acceptable operational behavior for the dynamic physical system, and
a topology of model components, each of the model components corresponding to a physical component within the dynamic physical system and including at least one reliability information value defining acceptable operational behavior of the model component, wherein at least one model component has reliability information for which one or more values have not been defined;
receive a request to generate one or more values for the reliability information for the at least one model component; and
in response to the request, execute the TCE model in iterative simulations such that operational behaviors of the model components having known reliability information values are varied across a value range(s) defined in the respective reliability information, an operational behavior of the at least one model component having undefined reliability information value is varied so as to determine a range of reliability information values that maintain operation of the TCE model within the acceptable operational behavior defined by the set of system-level requirements.

22. A computer-readable medium storing instructions, the instructions comprising one or more instructions that, when executed by one or more processors, cause the one or more processors to:

receive a technical computing environment (TCE) model that, when executed, simulates behavior of a dynamic physical system, the model including:

a set of system-level requirements defining acceptable operational behavior for the dynamic physical system, and a topology of model components, each of the model components corresponding to a physical component within the dynamic physical system and including at least one reliability information value defining acceptable operational behavior of the model component, wherein at least one model component has reliability information for which one or more values have not been defined;

receive a request to generate one or more values for the reliability information for the at least one model component; and in response to the request, execute the TCE model in iterative simulations such that operational behaviors of the model components having known reliability information values are varied across a value range(s) defined in the respective reliability information, an operational behavior of the at least one model component having undefined reliability information value is varied so as to determine a range of reliability information values that maintain operation of the TCE model within the acceptable operational behavior defined by the set of system-level requirements.

23. A device, comprising:
one or more processors to:
receive a model in a technical computing environment (TCE), the model when executed, simulating behavior of a dynamic physical system, the model including a set of system-level requirements defining acceptable operational behavior for the dynamic physical system, and a topology of model components, the model components corresponding to physical components within the dynamic physical system and including at least one reliability information value defining acceptable operational behavior of the model components;

receive a request to generate a system-level or application-level datasheet;

in response to the request, compile the system-level or application-level datasheet based on component level information and the model, the system-level or application-level datasheet including one or more of:
a set of values defining overall system performance;
a set of figures defining overall system performance;
a set of values defining system operating region constraints;
expected overall system reliability information and possible failure modes;
a listing of the physical components of the dynamic physical system;
known or determined reliability information values associated with the physical components; or
a representation of the topology of the model components corresponding to the physical components.

24. A computer-readable medium storing instructions, the instructions comprising one or more instructions that, when executed by one or more processors, cause the one or more processors to:

receive a model in a technical computing environment (TCE), the model when executed, simulating behavior of a dynamic physical system, the model including a set of system-level requirements defining acceptable operational behavior for the dynamic physical system, and a topology of model components, the model components corresponding to physical components within the dynamic physical system and including at least one reliability information value defining acceptable operational behavior of the model components;

receive a request to generate a system-level or application-level datasheet;

in response to the request, compile the system-level or application-level datasheet based on component level information and the model, the system-level or application-level datasheet including one or more of:
a set of values defining overall system performance;
a set of figures defining overall system performance;
a set of values defining system operating region constraints;
expected overall system reliability information and possible failure modes;
a listing of the physical components of the dynamic physical system;
known or determined reliability information values associated with the physical components; or
a representation of the topology of the model components corresponding to the physical components.

* * * * *